United States Patent
Chrudimsky et al.

(10) Patent No.: US 6,745,357 B2
(45) Date of Patent: Jun. 1, 2004

(54) DYNAMIC LOGIC SCAN GATE METHOD AND APPARATUS

(75) Inventors: David W. Chrudimsky, Austin, TX (US); Stephen C. Horne, Austin, TX (US); James S. Blomgren, Austin, TX (US); Michael R. Seningen, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 427 days.

(21) Appl. No.: 09/901,411

(22) Filed: Jul. 9, 2001

(65) Prior Publication Data

US 2001/0039635 A1 Nov. 8, 2001

Related U.S. Application Data

(63) Continuation-in-part of application No. 09/468,759, filed on Dec. 21, 1999, now Pat. No. 6,415,405, which is a continuation-in-part of application No. 09/179,330, filed on Oct. 27, 1998, now Pat. No. 6,118,304.

(51) Int. Cl.$^7$ ............................................... G01R 31/28
(52) U.S. Cl. ........................................ 714/726; 714/731
(58) Field of Search ........................... 364/578; 714/726, 714/724, 731, 727, 729; 438/11

(56) References Cited

U.S. PATENT DOCUMENTS

| 4,860,322 A | 8/1989 | Lloyd |
|---|---|---|
| 5,041,742 A | 8/1991 | Carbonaro |
| 5,120,988 A | 6/1992 | Matsuki |
| 5,122,679 A | 6/1992 | Ishii et al. |
| 5,124,572 A | 6/1992 | Mason et al. |
| 5,306,962 A | 4/1994 | Lamb |
| 5,410,686 A | 4/1995 | Kish |
| 5,434,520 A | 7/1995 | Yetter et al. |
| 5,450,455 A | 9/1995 | Hamilton et al. |
| 5,517,136 A | 5/1996 | Harris et al. |
| 5,760,610 A | 6/1998 | Naffziger |
| 5,764,092 A | 6/1998 | Wada et al. |
| 5,774,007 A | 6/1998 | Soneda |
| 5,774,511 A | 6/1998 | Boerstler |
| 5,841,670 A | * 11/1998 | Swoboda ..................... 364/578 |
| 5,870,411 A | 2/1999 | Durham et al. |
| 5,880,609 A | 3/1999 | Klass et al. |
| 5,886,540 A | 3/1999 | Perez |
| 5,896,046 A | 4/1999 | Bjorksten et al. |
| 5,917,331 A | 6/1999 | Persons |
| 5,923,188 A | 7/1999 | Kametani et al. |

(List continued on next page.)

OTHER PUBLICATIONS

Harris, Skew–Tolerant Domino Circuits, IEEE Journal of Solid–State Circuits, 11/97, p 1702–1711, vol. 32, No. 11.

U.S. Patent Application entitled "Method and Apparatus for Scan of Synchronized Cynamic Logic Using Embedded Scan Gates," Inventors: Horne, et al., Ser. No. 09/468,759, filed on Dec. 21, 1999.

Primary Examiner—David Ton
(74) Attorney, Agent, or Firm—Booth Wright LLP; Matthew J. Booth; Karen S. Wright

(57) ABSTRACT

A method and apparatus for random-access scan of a network 990 of dynamic logic or N-NARY logic that includes sequentially clocked precharge logic gates and one or more scan gates (900) driven by multiple overlapping clock signals generated from a clock generation circuit (904) coupled to a clock spine (902). Each clocked precharge logic gate and each scan gate include a logic tree (502) with one or more evaluate nodes, a precharge circuit (32), an evaluate circuit (36), and one or more output buffers (34). Each scan gate further includes a scan circuit (806) that accepts scan control signals (406, 408, 410, 824, and 826) and couples to one or more scan registers (416) in a RAM-like architecture. Scan control signals operate to capture the state of the output buffers of the scan gate, and to force the output buffers of the scan gate to a preselected level.

16 Claims, 19 Drawing Sheets

U.S. PATENT DOCUMENTS

| | | |
|---|---|---|
| 5,951,702 A | 9/1999 | Lim et al. |
| 5,952,861 A | 9/1999 | Kim et al. |
| 5,978,944 A * | 11/1999 | Parvathala et al. ......... 714/726 |
| 5,983,013 A | 11/1999 | Rogers et al. |
| 6,006,347 A * | 12/1999 | Churchill et al. ........... 714/724 |
| 6,018,254 A | 1/2000 | Rogers et al. |
| 6,100,734 A | 8/2000 | Flora |
| 6,158,032 A | 12/2000 | Currier et al. |
| 6,185,691 B1 | 2/2001 | Gandhi et al. |
| 6,242,269 B1 * | 6/2001 | Whetsel ...................... 438/11 |

* cited by examiner

DYNAMIC LOGIC SCAN GATE METHOD AND APPARATUS

CROSS-REFERENCE TO RELATED APPLICATIONS

This application is a continuation-in-part of the earlier filed U.S. Pat. App. Ser. No. 09/468,759, filed Dec. 21, 1999 now U.S. Pat. No. 6,415,405, which was a continuation-in-part of the earlier filed U.S. Ser. No. 09/179,330, now U.S. Pat. No. 6,118,304, filed Oct. 27, 1998, both of which are incorporated by reference for all purposes into this specification.

BACKGROUND OF THE INVENTION

1. Field of the Invention

The present invention relates to the field of testing dynamic logic and related logic families such as N-NARY logic. More specifically, the present invention relates to scan testing of dynamic logic and N-NARY logic using on-chip circuitry.

2. Description of the Related Art

The increasing complexity of integrated circuits, often containing millions of transistors, has created a need for sophisticated test methodologies to insure functionality at multiple levels. Semiconductors must undergo some degree of functional testing before they are shipped to computer and other device manufacturers, and they must be periodically tested during further manufacturing and during their operating life to verify continuing operability. One of the problems encountered in testing is the difficulty in accessing and isolating circuits that are deeply embedded in the chip.

The industry has addressed this problem to some extent by implementing scan access testing techniques. Scan access refers broadly to the use of specialized serial shift registers ("scan registers") to deliver stimulus vectors from a stimulus pattern generator to circuit nodes of interest, and to retrieve response data from circuit nodes of interest for analysis. Scan registers function as normal synchronous registers and latch data propagating through the computational logic. However, scan registers can also be interconnected in such a way as to allow propagation of data directly from register to register upon assertion of control signals or clocks, thereby bypassing any computation logic between the registers. This provides a means whereby stimulus data may be transported directly to internal circuit nodes without propagating through computational logic, and whereby response data may be retrieved directly from internal circuit nodes without propagating through computational logic, thus allowing designers to isolate sections of logic for testing.

The benefit of scan access increases as the proportion of circuit nodes otherwise inaccessible from primary inputs and outputs increases. "Full scan" refers to an implementation of scan access wherein every register on a chip is accessible through scan. "Partial scan" refers to an implementation of scan access wherein some subset of the registers on a chip is accessible through scan.

Conventional scan access, i.e., propagating data through a long chain of interconnected scan registers, is inherently serial in nature. The number of clock cycles needed to load or unload the scan chain is equal to the number of registers in the chain. Gaining access to internal nodes is therefore accomplished only at the cost of very long test times.

Alternate scan architectures such as random access scan have been used to remedy the test time problem caused by the serial nature of scan access. Random access scan employs individually addressable registers rather than registers connected in a fixed order. This adds greater flexibility to the order in which registers may be accessed, but reduces overall test time only when writing or reading some subset of the registers. Random access scan does not decrease the total number of clock cycles needed to write or read all registers.

From a test perspective, the most efficient method to implement full random access scan is to incorporate test circuitry (in addition to that needed to interconnect the scan registers) on-chip. Placing circuitry on chip eliminates the need to develop specialized test hardware, and potentially enables desirable test options such as testing of the chip under special clock conditions, or in situ following the integration into a system-level product.

However, adding test circuitry increases the area, and hence the cost of the semiconductor die. When test circuitry is incorporated into a semiconductor, the benefit gained by increased test coverage must be traded off against the increased die area and associated cost. Moreover, the test circuitry must not interfere with the normal operation of the chip. Because of these constraints, the ratio of circuitry under test to test circuitry in current semiconductors is relatively high. Consequently, typical on-chip random access scan implementations control and observe only the primary inputs and outputs of relatively large blocks of logic. Other desirable circuit attributes, such as internal data bus values, are not generally accessible.

Moreover, while random-access scan using on-chip circuitry does significantly improve manufacturing testability, designers have been thus far unable to capitalize on its potential to facilitate chip debug during the design process. In general, most test points on a chip can only be scanned when the chip is in a "scan mode," meaning that the clocks are stopped or slowed significantly, the machine is given a set of input test vectors which propagate through the logic, and outputs are then scanned and analyzed to determine whether the logic is operating properly. Thus, when a chip is in scan mode the information in a scan register is somewhat artificial, in that it did not arrive under normal operating conditions, and it is the result of a test vector rather than a real application running on the processor.

Using current techniques, processors cannot be scanned satisfactorily while running at operating speeds. A processor's clocks cannot be stopped abruptly to read a test point without causing a voltage overload in the supply network due to the very high di/dt. This limitation means that designers generally have no visibility into what is happening internally in real time, which significantly hampers troubleshooting and debugging performance-related problems. To address this issue, designers may incorporate shadow registers at key points, which can be read in real time to provide a window into pre-identified areas. However, this solution is less than ideal, particularly for highly complex designs, in that it requires up-front identification of points of interest. Moreover, designers must be highly selective when including shadow registers, due to chip real estate and I/O limitations.

The present invention is an improved scan approach that utilizes a RAM-like scan bus architecture to provide visibility into even deeply embedded logic within a chip. While the present invention can be applied to implement scan in any dynamic logic design, the advantages of the present invention are best realized in a design wherein the logic is synchronized using multiple clock domains with overlapping phases, as described in U.S. Pat. No. 6,118,304, entitled "Method and Apparatus for Logic Synchronization" (hereinafter, "the Logic Synchronization Patent"). In designs that employ this logic synchronization method, the present invention allows the processor to be stopped, information to be accessed or provided, processor state to be modified, and operation to be resumed, all without corrupting the machine's architectural state. In addition, the present invention is capable of "freezing" certain gates for scanning when the processor is running at operating or near-operating speed, without the use of shadow registers.

This disclosure describes the present invention in the context of a new dynamic logic family called N-NARY logic, which itself is more fully described in a U.S. Pat. No. 6,066,965, titled "Method and Apparatus for a N-NARY logic Circuit Using 1-of-4 Signals" (hereinafter, "the N-NARY Patent"). The N-NARY patent is incorporated by reference for all purposes. Those skilled in the art will understand, after reading this specification or practicing the present invention, that the present invention can be implemented in other applications that employ other logic design methodologies.

Finally, this application is also related to the following copending U.S. Patent Applications and U.S. Patents: U.S. Pat. No. 6,118,716, filed Sep. 9, 1998; U.S. Pat. App. Ser. No. 09/206,900, filed Dec. 7, 1998; U.S. Pat. App. Ser. No.09/206,905, filed Dec. 7, 1998; U.S. Pat. App. Ser. No. 09/191,813, filed Nov. 13, 1998; U.S. Pat. App. Ser. No. 09/468,760, filed Dec. 21, 1999; and U.S. Pat. App. Ser. No. 09/468,972, filed Dec. 21, 1999. These six documents are hereby incorporated by reference for all purposes into this specification.

SUMMARY

The present invention comprises a method and apparatus for random-access scan of a network of dynamic logic or N-NARY logic, wherein the network includes sequentially clocked precharge logic gates and one or more scan gates. Each clocked precharge logic gate and each scan gate further comprise a logic tree having one or more evaluate nodes, a precharge circuit, an evaluate circuit, and one or more output buffers. Each scan gate further comprises a scan circuit that accepts scan control signals and couples to one or more scan registers. A scan control circuit generates scan control signals which operate to capture the state of the output buffers of the scan gate and provide that state to one or more scan registers. Scan control signals also operate to force the output buffers of the scan gate to a preselected level, which then propagates through the network to create an output state on the next scan gate in the network, which can then be read and compared to an expected output state given the output state of the previous scan gate.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a method and apparatus to scan N-NARY or other dynamic logic circuits using a RAM-like bus architecture and careful control of the clock input to selected scan gates. This disclosure describes numerous specific details that include specific structures, circuits, and logic functions in order to provide a thorough understanding of the present invention. One skilled in the art will appreciate that one may practice the present invention without these specific details.

N-NARY logic is a novel logic family that uses a novel signal, a 1 of N signal, to convey information. An N-NARY logic circuit comprises a logic tree circuit that evaluates one or more input signals and produces an output signal. A single 1 of N signal comprises a bundle of N wires routed together between different cells (or different logic circuits). A 1 of N signal uses a 1 of N encoding to indicate multiple values of information conveyed by the bundle of wires of the 1 of N signal where at most one and only one wire of the bundle of wires of the 1 of N signal is true during an evaluation cycle. Additionally, the 1 of N encoding provides a not valid value (a null value) where zero wires of the bundle of wires of the 1 of N signal is true during an evaluation cycle.

Figure 1:
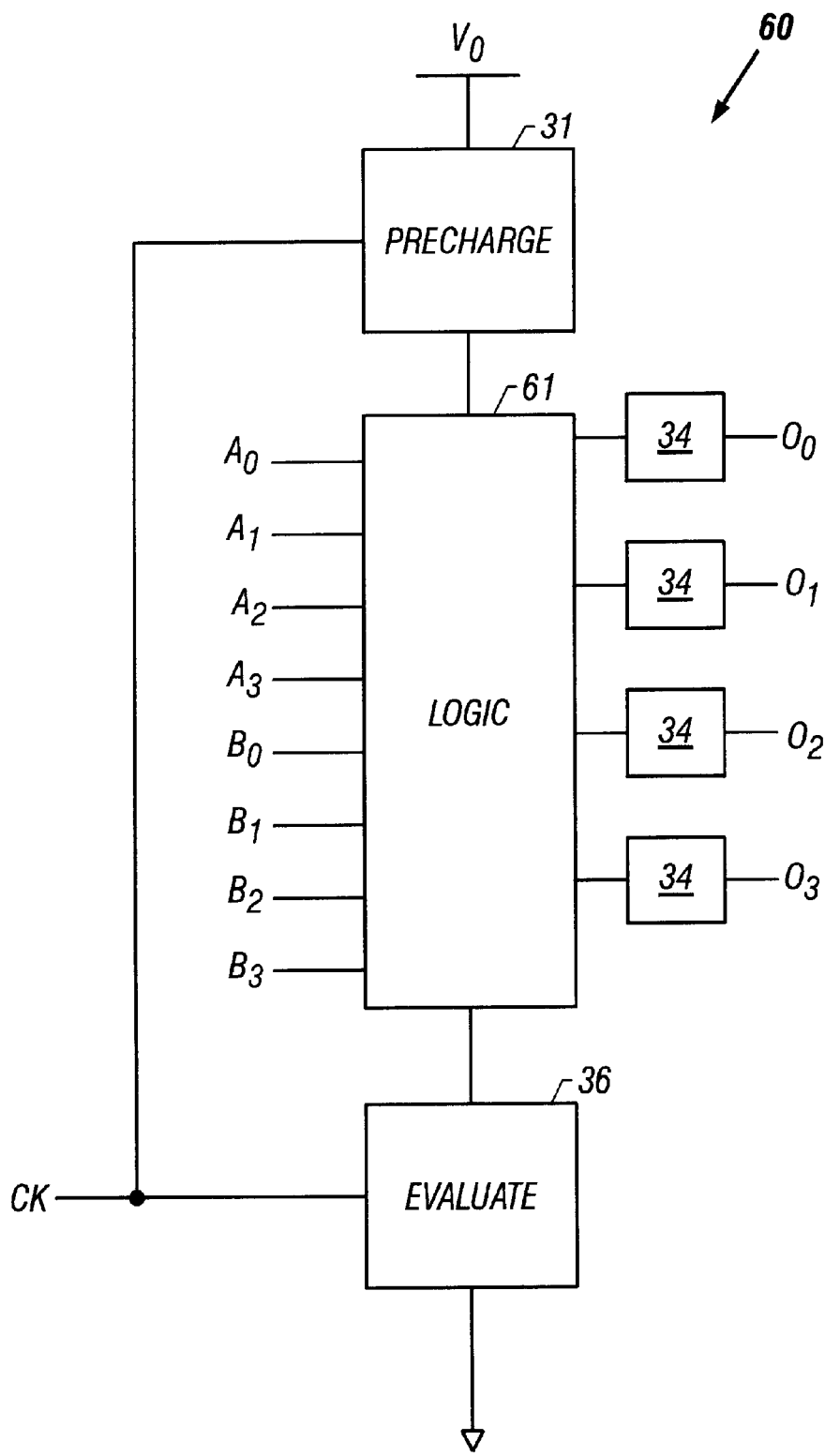
FIG. 1 is a block diagram of an N-NARY logic circuit.

FIG. 1 is a block diagram of an N-NARY logic circuit that illustrates a circuit of N-NARY logic using two sets of 1 of 4 signals for the input signals and a 1 of 4 signal for the output signal. This circuit describes a 2 bit logic gate (a dit) where A is a 2 bit input, B is a 2 bit input, and O is a 2 bit output. In other words, a dit device produces 2 output bits. A device 60 comprises a logic tree circuit 61, a precharge circuit 31, and an evaluate circuit 36. Coupled to the logic tree circuit is the 2 bit input signal A, which is a 1 of 4 signal that comprises a plurality of input values $A_0, A_1, A_2,$ and $A_3$ and their associated wires or logic paths using a 1 of 4 encoding. Additionally coupled to the logic tree circuit is the 2 bit input B, which is another 1 of 4 signal that comprises a plurality of input values $B_0, B_1, B_2,$ and $B_3$ and their associated wires or logic paths using a 1 of 4 encoding. Coupled to the logic tree circuit is the 2 bit output O, which is a 1 of 4 signal that comprises a plurality of output values $O_0, O_1, O_2,$ and $O_3$ and their associated wires or logic paths using a 1 of 4 encoding. The logic tree circuit 61 performs a logic function on a plurality of input signals that could comprise a variety of functions, for example, the Boolean logic functions AND/NAND, OR/NOR, or XOR/Equivalence.

A precharge circuit 31 couples to the logic tree circuit 61 and precharges the dynamic logic of the logic tree circuit. Each evaluation path of the logic tree circuit has its own precharge P-FET. And, coupled to the precharge circuit 31 is the clock signal CK where a low clock signal on CK will cause the P-FETs to charge.

An evaluate circuit 36 couples to the logic tree circuit and controls the evaluation of the logic tree circuit. And, coupled to the evaluate circuit 36 is the clock signal CK where a high clock signal on CK will cause the N-FET in the evaluate circuit to evaluate.

Figure 2A:
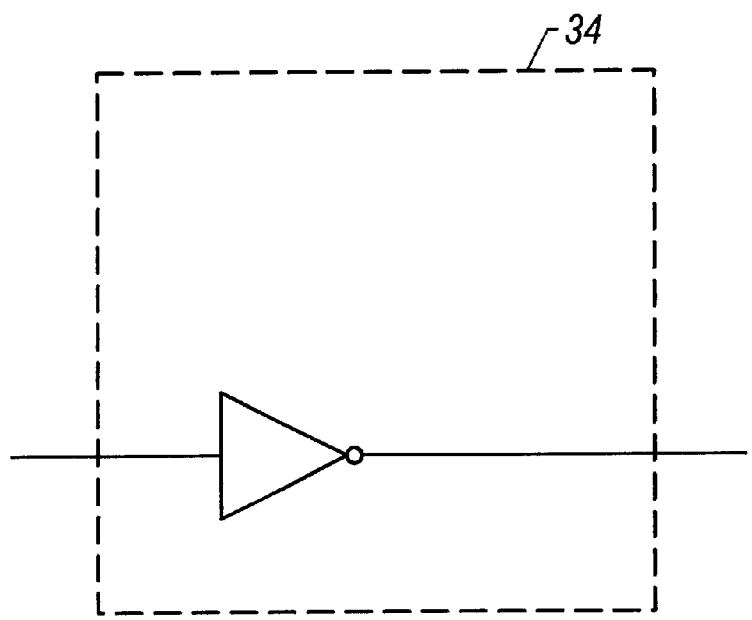
FIGS. 2A, 2B, 2C, and 2D illustrate buffer devices used in N-NARY logic.
Figure 2B:
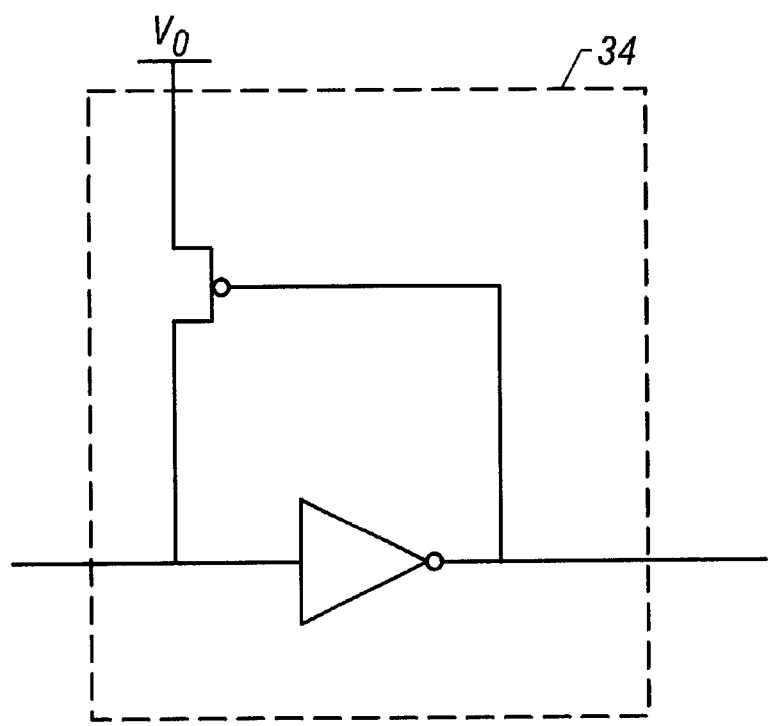

As shown in FIG. 1, output buffers 34 couple to the wires of the plurality of output signals. FIGS. 2A, 2B, 2C, and 2D provide four embodiments of buffer device 34 used in N-NARY logic. FIG. 2A shows a CMOS inverter that inverts the signal on an output logic path. FIG. 2B shows an embodiment of output buffer 34 that is preferred for most N-NARY gates that includes the CMOS inverter that inverts the signal and a feed back keeper transistor that maintains the level of the dynamic node before the signal evaluates. The PFET keeper transistor gives the logic gate a static capability. Additionally, this type of output buffer compensates for parasitic leakages and allows for low speed functionality. The FIG. 2B output buffer 34 is called a half-keeper output buffer.

Figure 2C:
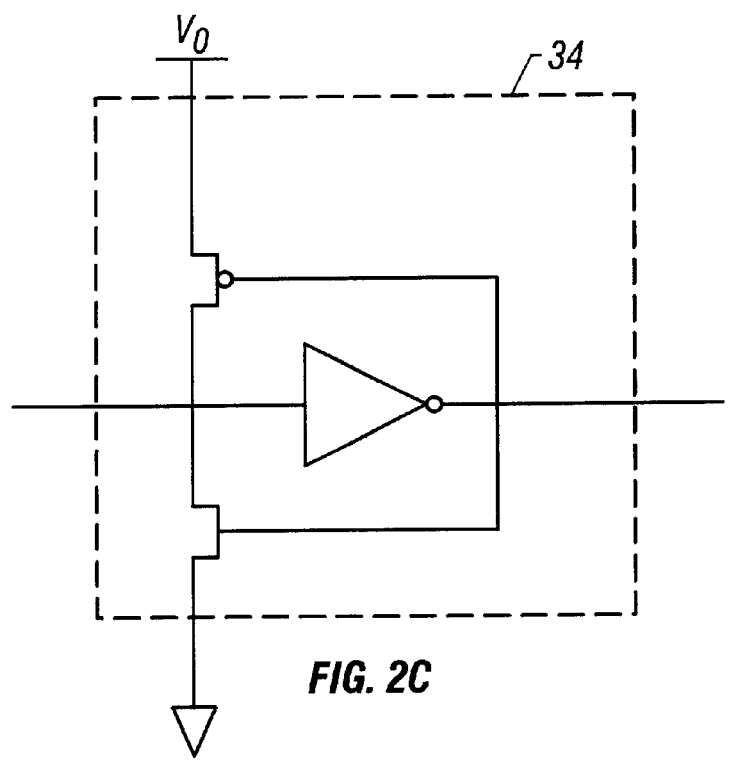
Figure 2D:
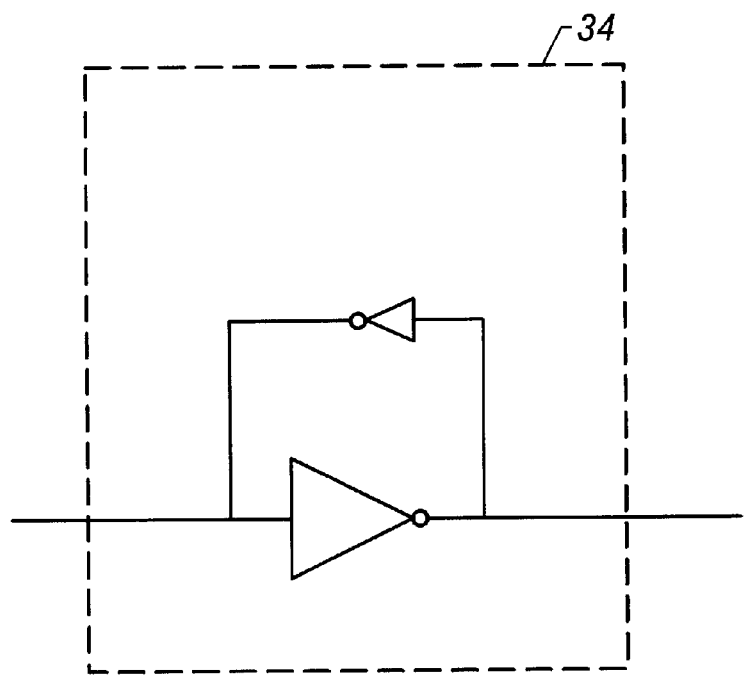

FIG. 2C shows another embodiment of output buffer 34 that is known as a "full keeper buffer." As shown in FIG. 2C, a full keeper buffer includes the inverter, the PFET keeper feedback transistor, and an additional NFET feedback transistor tied to ground. Those skilled in the art will recognize that FIG. 2D is simply another schematic representation of the FIG. 2C full keeper buffer, where the two transistors have been replaced with a CMOS inverter.

Figure 3:
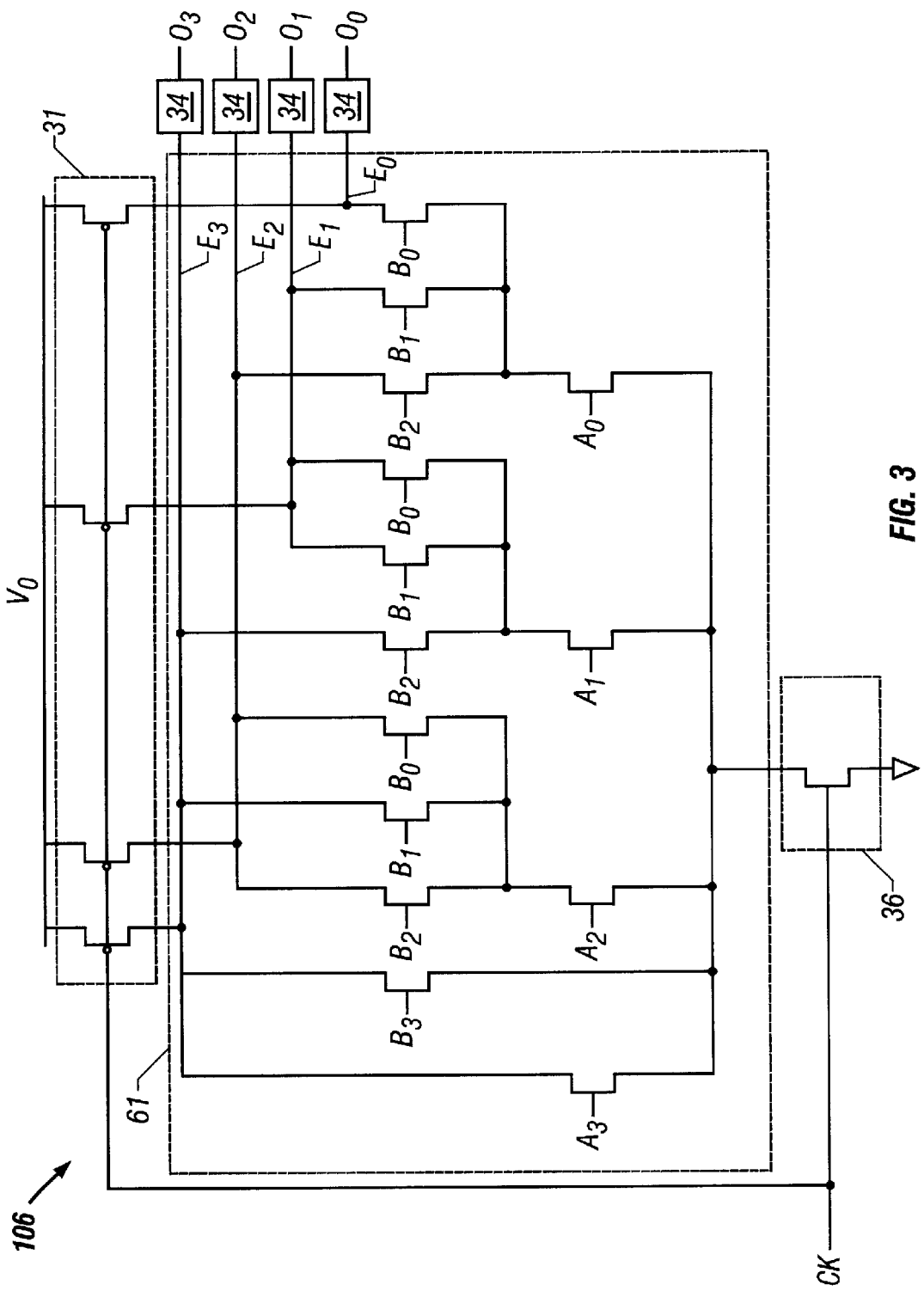
FIG. 3 is a schematic diagram of an N-NARY logic circuit.

FIG. 3 is a schematic diagram of an N-NARY logic circuit using a 1 of 4 encoding, where the logic tree 61 comprises the OR/NOR function. One skilled in the art will appreciate that one function is the inverse of the other function. To reduce adding additional capacitance to the device, N-NARY logic uses a single, shared logic tree with multiple evaluation paths for evaluating the function of the logic circuit and for generating the plurality output signals coupled to the logic circuit. The multiple evaluation paths further comprise the internal evaluate nodes $E_0, E_1, E_2,$ and $E_3$.

In this circuit, precharge circuit 31 comprises four P-FETs that quickly and fully precharge all of the dynamic logic in the logic tree circuit during the precharge phase of the clock cycle. As shown in FIG. 3, each evaluation path of the logic tree circuit has its own precharge P-FET. Clock signal CK is coupled to the precharge circuit 31. When the clock signal is low, circuit 31 precharges the N-FETs in the logic tree circuit 61.

The evaluate circuit 36 comprises a single evaluation transistor, which aids in the speed of the clocking of the device and helps avoid races between other devices. Other circuits may use multiple evaluation devices. As shown in FIG. 3, clock signal CK couples to evaluate circuit 36. When the clock signal is high, the evaluate circuit 36 evaluates the logic tree circuit 61.

Figure 4:
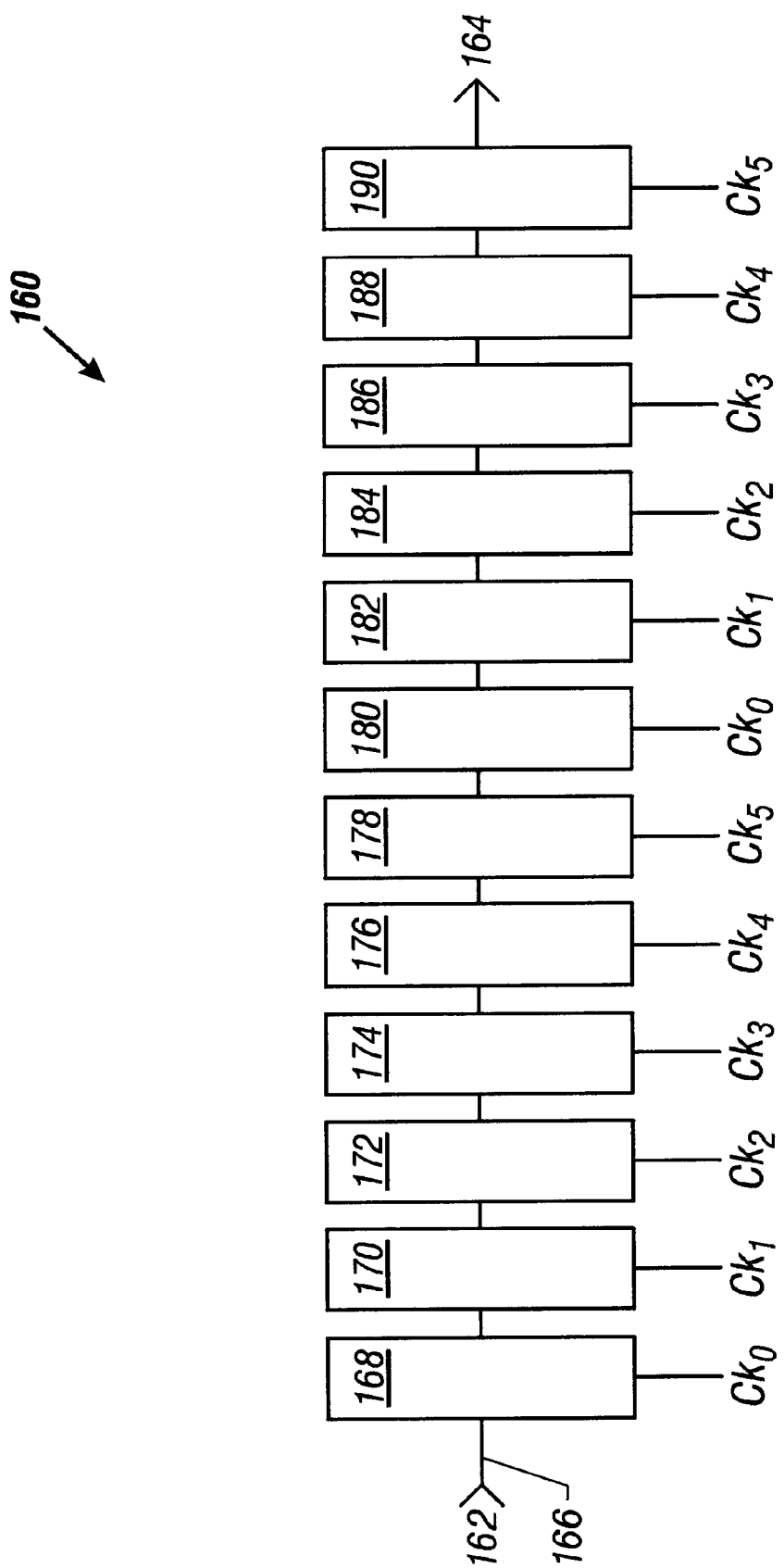
FIG. 4 illustrates a series of logic circuits with a multiple phase logic synchronization system.

FIG. 4 illustrates a network of logic circuits or gates with a multiple phase logic synchronization scheme that uses a six phase clocking system with the clocks CK0, CK1, CK2, CK3, CK4, and CK5. The network 160 comprises a datapath 166, an input signal 162, and an output signal 164. The datapath 166 comprises one or more wires that propagate the signals through the network. For example, the datapath 166 may comprise one or more N-NARY signals. Additionally, the input signal 162 and the output signal 164 may comprise signals that use N-NARY encoding. The series of logic circuits 160 comprises the logic circuits 168, 170, 172, 174, 176, 178, 180, 182, 184, 186, 188, and 190 coupled in series to the datapath 166.

In FIG. 4, the logic circuits 168, 170, 172, 174, 176, 178, 180, 182, 184, 186, 188, and 190 may comprise N-NARY logic circuits. Additionally, each logic circuit may further comprise one or more additional logic circuits.

Figure 5:
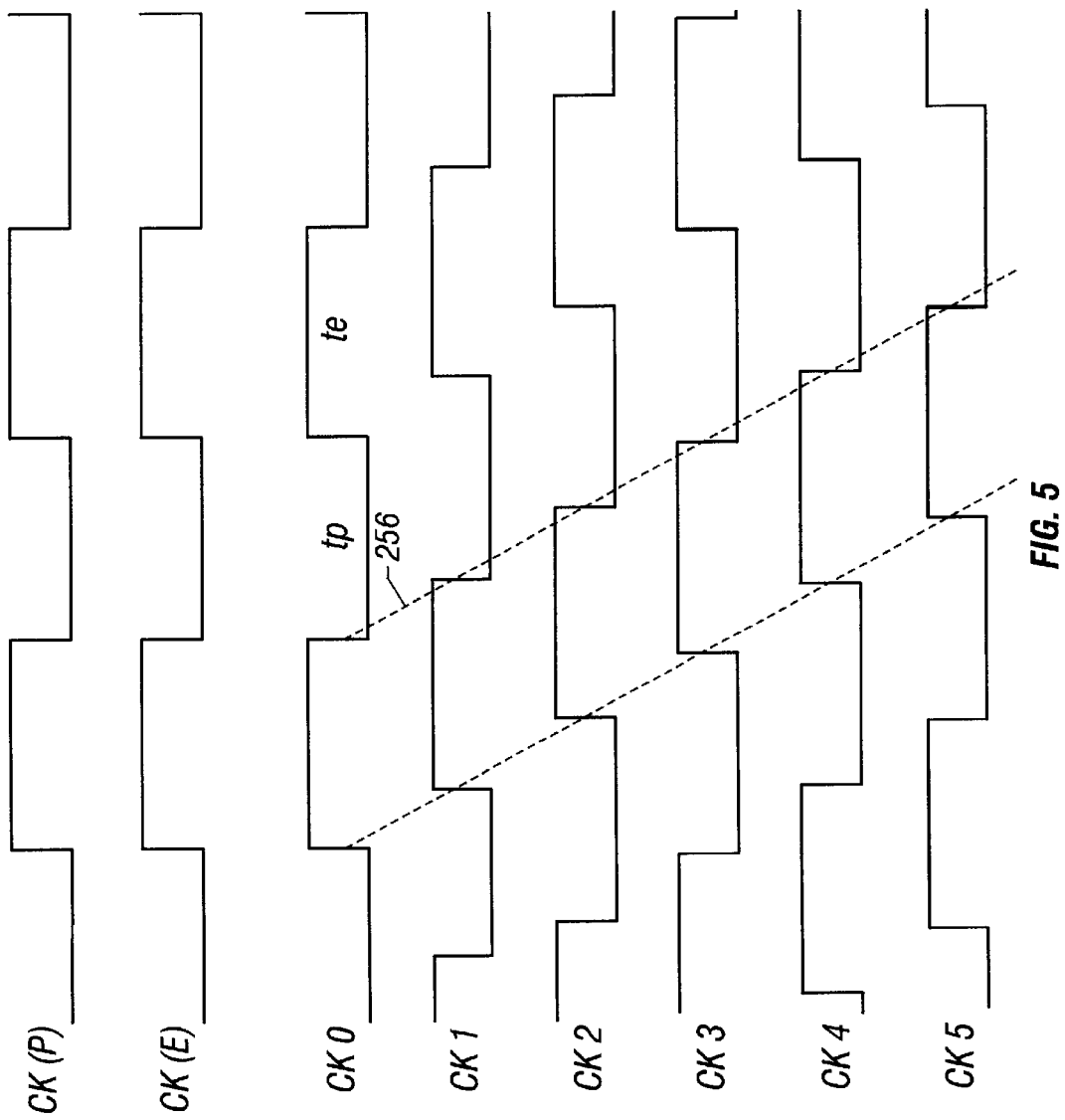
FIG. 5 illustrates the multiple overlapping clock phases used in the present invention.

FIG. 5 illustrates the multiple overlapping clock phase scheme that is the preferred timing and logic synchronization methodology for the present invention. In FIG. 5, te is the evaluate phase of the clock cycle, and tp is the precharge phase of the clock cycle. Additionally, each individual clock has a 50% duty cycle. The phases of the different clocks are such that the phase of an individual clock signal overlaps the phase of an earlier clock signal by an amount approximately equal to the amount it overlaps of the phase of the next clock signal. FIG. 5 illustrates an M-phase clocking system, where M=6, with clocks CK0, CK1, CK2, CK3, CK4, and CK5. Reference 256 illustrates the propagation of the "wave" of the evaluate cycles of the different clocks. For further background and detail on this logic synchronization methodology, the reader is referred to the Logic Synchronization Patent.

As shown in FIG. 4, the logic circuits are coupled together such that, in general, the input of a logic circuit that receives a particular phase logic clock signal (e.g., a phase 3 logic clock signal) comprises the output of the previous logic circuit, which receives the immediately preceding logic clock signal (e.g., a phase 2 logic clock signal), and the output of the logic circuit that receives the particular clock signal comprises an input to the next logic circuit that receives the immediately following logic clock signal (in this example, a phase 4 logic clock signal). In a preferred embodiment, the master or global clock signal is supplied to the network from a central bus structure referred to in this specification as the "clock spine." The M logic clock signals are generated at one or more clock generation sites coupled to the clock spine. In other embodiments, the clock spine may include other useful clock-related signals (such as, for example, the inverse of the global clock signal), or even one or more of the individual logic clock signals.

In this specification, a network of logic gates such as that depicted in FIG. 4 wherein the logic propagation is synchronized using an evaluate "wave" produced by multiple overlapping clock signals, such as that shown in FIG. 5, is referred to as a "sequentially clocked precharge logic network," the gates therein are referred to as "sequentially clocked precharge logic gates," and the clock signals are "sequentially generated" with a "sequential delay" between the individual clock signals. Similarly, when referring to individual sequentially generated logic clock signals, the first clock signal that rises and falls after a specific logic clock signal is said to "immediately follow" that specific clock signal; the signal that rises and falls just before a specific logic clock signal rises and falls is said to "immediately precede" the specific logic clock signal. In other words, in FIG. 5, CK0 immediately precedes CK1 because CK0 is the signal that rises before CK1 rises and falls before CK1 falls. Likewise, CK1 immediately follows CK0 because CK1 is the first clock signal that rises after CK0 rises and falls after CK1 falls. Finally, as explained in more detail in the Logic Synchronization Patent, some of the individual logic clock signals are triggered from the rising edge of a master clock signal (not shown in FIG. 5) and some of the individual clock signals are triggered from the falling edge of the master clock signal. Those skilled in the art will recognize that it is the designer's choice of which clock signals trigger from the master clock's rising and/or falling edge; it is the arrangement of multiple overlapping clock signals that provides a "wave" of evaluate cycles that provides the novel logic synchronization and timing methodology shown and described in the Logic Synchronization Patent.

FIG. 5 also illustrates two additional clock signals, CK(E) and CK(P). The preferred embodiment of the present invention requires the precharge clock CK(P) to be controlled separately from the evaluate clock CK(E). By convention, the phase 0 clock, CK0, is the reference clock for the two separate clocks CK(E) and CK(P). One skilled in the art will appreciate that it is possible to use other conventions for logic synchronization, for example, an M-phase clocking system where M=4, which would use clock signals CK0, CK1, CK2, and CK3. Similarly, it is possible to use other phase clock signals (e.g., CK1 or CK4) for the CK(P) and CK(E) references.

Figure 6:
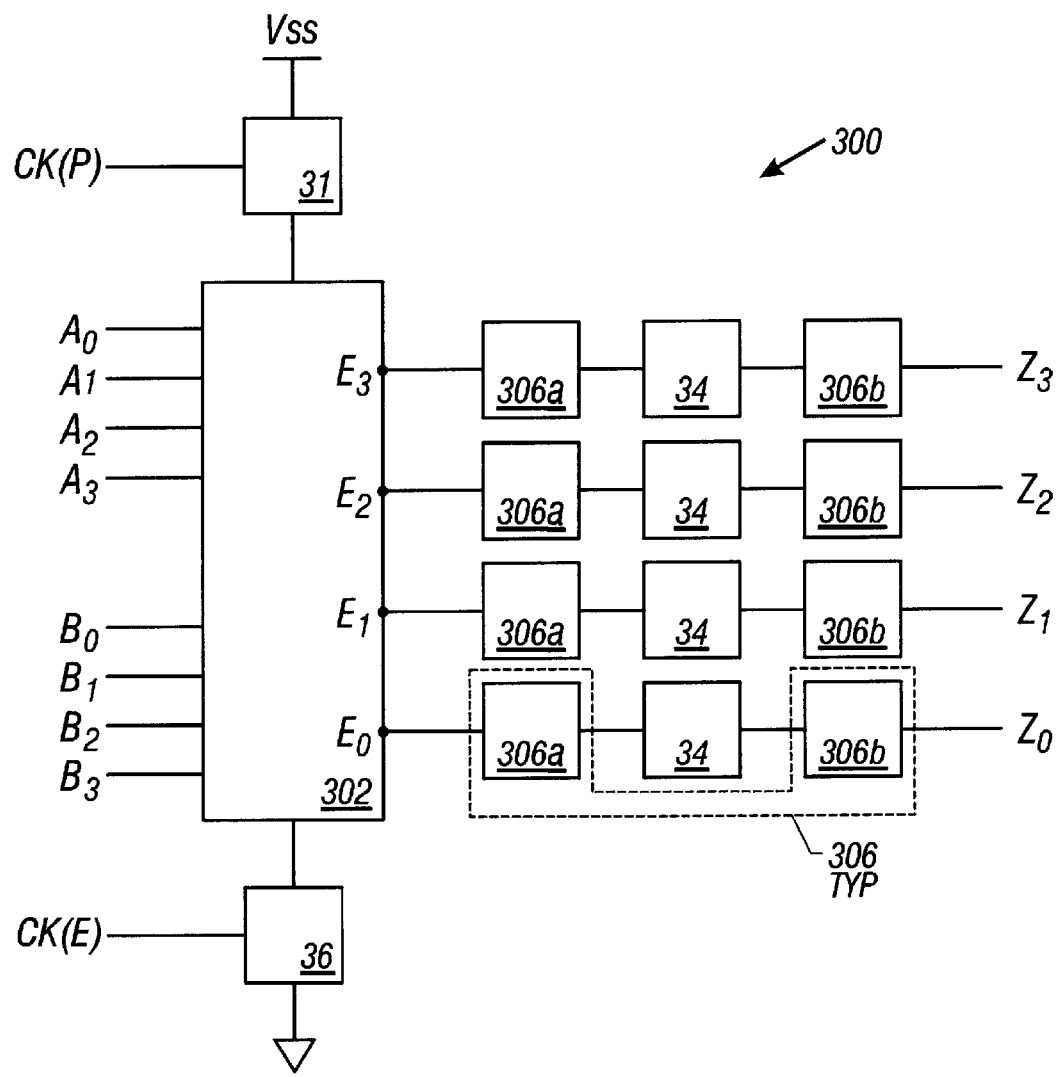
FIG. 6 is an embodiment of the present invention.

FIG. 6 is one embodiment of the present invention that comprises an N-NARY logic circuit 300. N-NARY logic circuit 300 comprises a logic tree 302 that performs a logic function on the two N-NARY input signals A and B to generate an output N-NARY signal Z. The N-NARY input signal A comprises the input values $A_0$, $A_1$, $A_2$, and $A_3$ and their associated wires; the N-NARY input signal B comprises the input values $B_0$, $B_1$, $B_2$, and $B_3$ and their associated wires; and the N-NARY output signal Z comprises the output values $Z_0$, $Z_1$, $Z_2$, and $Z_3$ and their associated wires. The logic circuit 300 additionally comprises the precharge circuit 31 that receives the precharge clock CK(P) (one component of the phase 0 clock, as described above). And, the logic circuit 300 comprises the evaluate device 36 that receives the evaluate clock CK(E) (another component of the phase 0 clock) Output buffers 34 couple to the wires of the output signal Z.

As shown in FIG. 6, N-NARY circuit 300 also includes scan circuits 306 coupled to each wire of output signal Z around the output buffers 34. Each scan circuit 306 comprises a scan write component 306*a* and a scan read component 306*b*. Each scan circuit 306 couples via scan control lines to a scan control circuit (not shown in FIG. 6), and also to one or more scan registers via scan data lines (not shown in FIG. 6).

As described more fully in the Stress Mode patent referenced above, N-NARY circuit 300 may also include stress state generation circuits that couple to state generation control circuits that provide the ability to stress test the N-NARY circuits. Those skilled in the art will recognize that stress testing is generally unrelated to scan. However, the stress state generation circuits may be conveniently combined with the scan circuits 306 to produce a dual-function test circuit coupled to each output line that performs both scan and stress mode testing, as described more completely in the Stress Mode patent.

Figure 7:
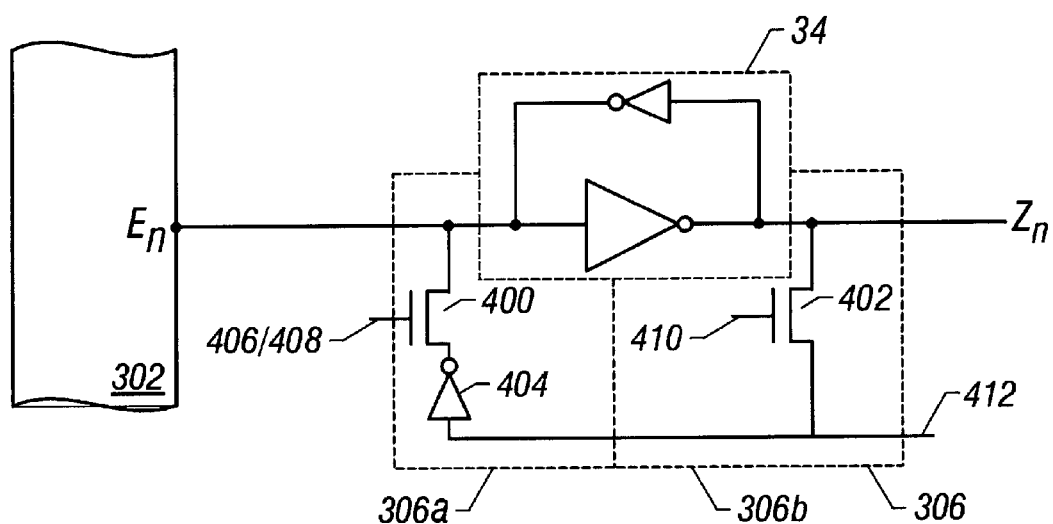
FIG. 7 illustrates a scan circuit used in the present invention.

FIG. 7 shows one embodiment of a scan circuit 306. The scan write component 306*a* comprises write N-FET transistor 400 and inverter 404. The scan read component 306*b* comprises read N-FET transistor 402. Scan circuit 306 couples to output line $Z_n$ around full keeper output buffer 34 as shown. Write transistor 400 is controlled by scan control signals 406 and 408. Read transistor 402 is controlled by scan control signal 410. Information is transported into and out of the scan circuit 306 over scan data lines 412.

Figure 8:
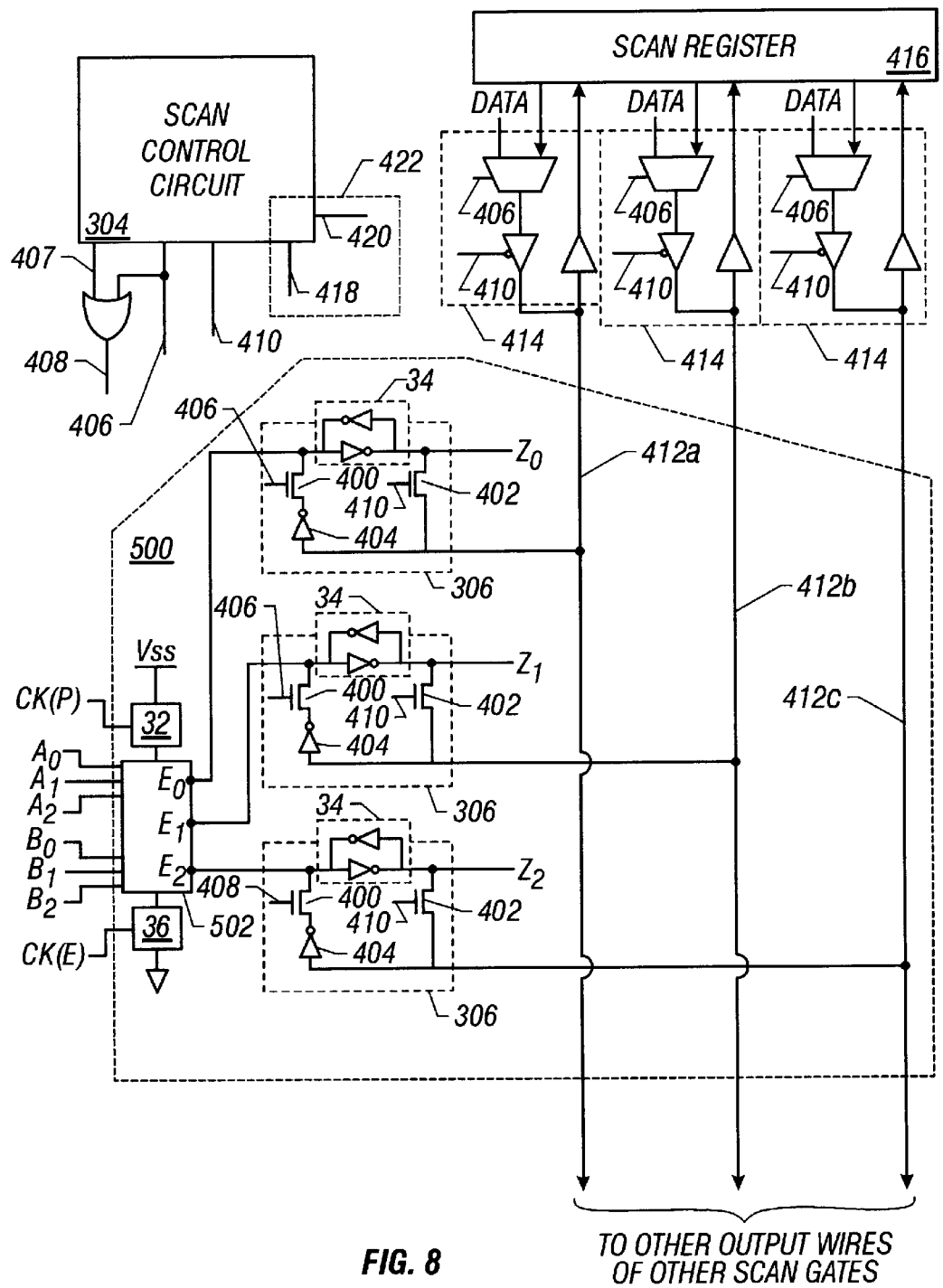
FIG. 8 illustrates an embodiment of the scan architecture used in the present invention.

FIG. 8 shows one embodiment of the complete architecture of the present invention, in the context of a 1-of-3 N-NARY circuit. In this specification, an N-NARY circuit that includes the necessary components for scan is referred to as a "scan gate." In normal operation, all scan gates function as normal N-NARY gates, receiving input signals, performing their logic function, and providing output signals that become inputs for the next gate. By convention, all Phase 0 gates are selected to be scan gates, however, those skilled in the art will appreciate that the scan architecture and techniques disclosed herein could be practiced using other phase gates as scan gates without departing from the present invention.

As shown in FIG. 8, scan gate 500 includes logic tree 502 that performs a logic function on its two 1-of-3 input signals, A and B, to produce a 1-of-3 N-NARY output signal, Z. Precharge circuit 32 and evaluate circuit 36 couple to N-NARY logic tree 502. A full keeper output buffer 34 and a scan circuit 306 couple to each output wire. Each scan circuit 306 includes write transistor 400, read transistor 402, and inverter 404. Each scan circuit 306 connects to a separate scan data line 412*a*, 412*b*, and 412*c*, each of which connects through a read/write driver 414 to the scan register 416 in an arrangement similar to commonly-known RAM architecture. As shown in FIG. 8, scan data lines 412*a*, 412*b*, and 412*c* also connect to the output wires of other scan gates in other rows on a device that employs the present invention scan architecture and methodology.

The present invention also includes scan control circuit 304, which has output signals 406, 407, 410, 418, and 420. Scan Enable (SEN) signal 420 is asserted when the system is in scan mode to control the timing of the scan gates, as explained in more detail below. Write signal 406 is asserted when the system is in scan mode and the wires of the output signal Z are to be forced to the value in the scan register 416. Read signal 410 is asserted when the system is in scan mode and the value on each wire of the output signal Z is to be loaded into the scan register 416, which can then be scanned out in serial fashion. Reset signal 407 is asserted during the reset sequence to reset the circuit for normal operation, as described in further detail below. Scan Precharge signal 418 is asserted to precharge the scan gates for writing during scan.

In scan mode, when the Read signal 410 is high and Write signal 408 and Reset signal 407 are low, read transistors 402 conduct, write transistors 400 are open, and the current state of the output lines $Z_0$, $Z_1$, and $Z_2$ is scanned and loaded into the scan register 416 via scan data lines 412 and read/write drivers 414. To write to a scan gate, Scan Precharge 418 is asserted to drive the evaluate nodes high. When the Read signal 410 is low, Reset 407 is low, and Write 408 is high, read/write drivers 414 pull scan data lines 412 high or low, depending upon the bit value in the scan register 416. Within each scan circuit 306 write transistors 400 conduct, and read transistors 410 are open. The voltage on the scan data lines 412 is inverted by inverters 404, and the value of the evaluate node $E_0$ is forced to the inverted value on the scan data line 412$a$, the value of $E_1$ is forced to the inverted value on 412$b$, and the value of $E_2$ is forced to the inverted value on 412$c$. These inverted values are then inverted once again in output buffers 34, and the values of $Z_0$, $Z_1$, and $Z_2$ are forced to the values in the scan register.

Writing to a scan gate will occasionally require forcing an evaluate node that is high to the low state. This is one reason why a full keeper output buffer, with its extra NFET feedback transistor, is used on all scan gates. Also, since both the precharge and evaluate clocks are turned off just before a scan read (the status and relationship between the various clock signals during scan is discussed in detail below), a full keeper holds the evaluate nodes at the state they were in when the clocks were turned off so that they can be read.

Note that the write transistor 400 in the scan circuit 306 coupled to output wire $Z_2$ is driven by the Write-or-Reset (WOR) signal 408, while all other write transistors 400 in the other scan circuits 306 are driven by the Write signal 406. As shown in FIG. 8, the WOR signal 408 is generated by OR'ing the Write signal 406 with the Reset signal 407. In scan mode, when the write signal 406 is asserted and the reset signal 407 is not asserted, the scan circuit 306 that accepts the WOR signal 408 behaves like the other scan circuits 306, as described above. However, in reset mode, when the reset signal 407 is asserted and neither the write signal 406 nor the read signal 410 is asserted, only the write transistor 400 in the scan circuit 306 that accepts the WOR signal 408 will conduct. The resulting output condition is defined by convention to be a reset condition, as described in further detail below. The present invention requires that one and only one output wire of the N-NARY output signal of a scan gate must couple to a scan circuit 306 that includes a write transistor 400 that is driven by the WOR signal 408 rather than the Write signal 406.

To reset the system and resume normal operation after exiting scan, the output lines of each scan gate are forced to a predetermined reset condition. For example, in the embodiment shown in FIG. 8, the system is reset by forcing $Z_0$ and $Z_1$, low and $Z_2$ high. This is accomplished by first precharging the evaluate nodes $E_0$, $E_1$, and $E_2$, and then asserting the WOR signal 408, which pulls $E_2$ low. The output buffers 34 then invert the state of the evaluate nodes, and the resulting condition is $Z_0$ and $Z_1$ low and $Z_2$ high. When every scan gate is in this output state, the system is reset.

Figure 9:
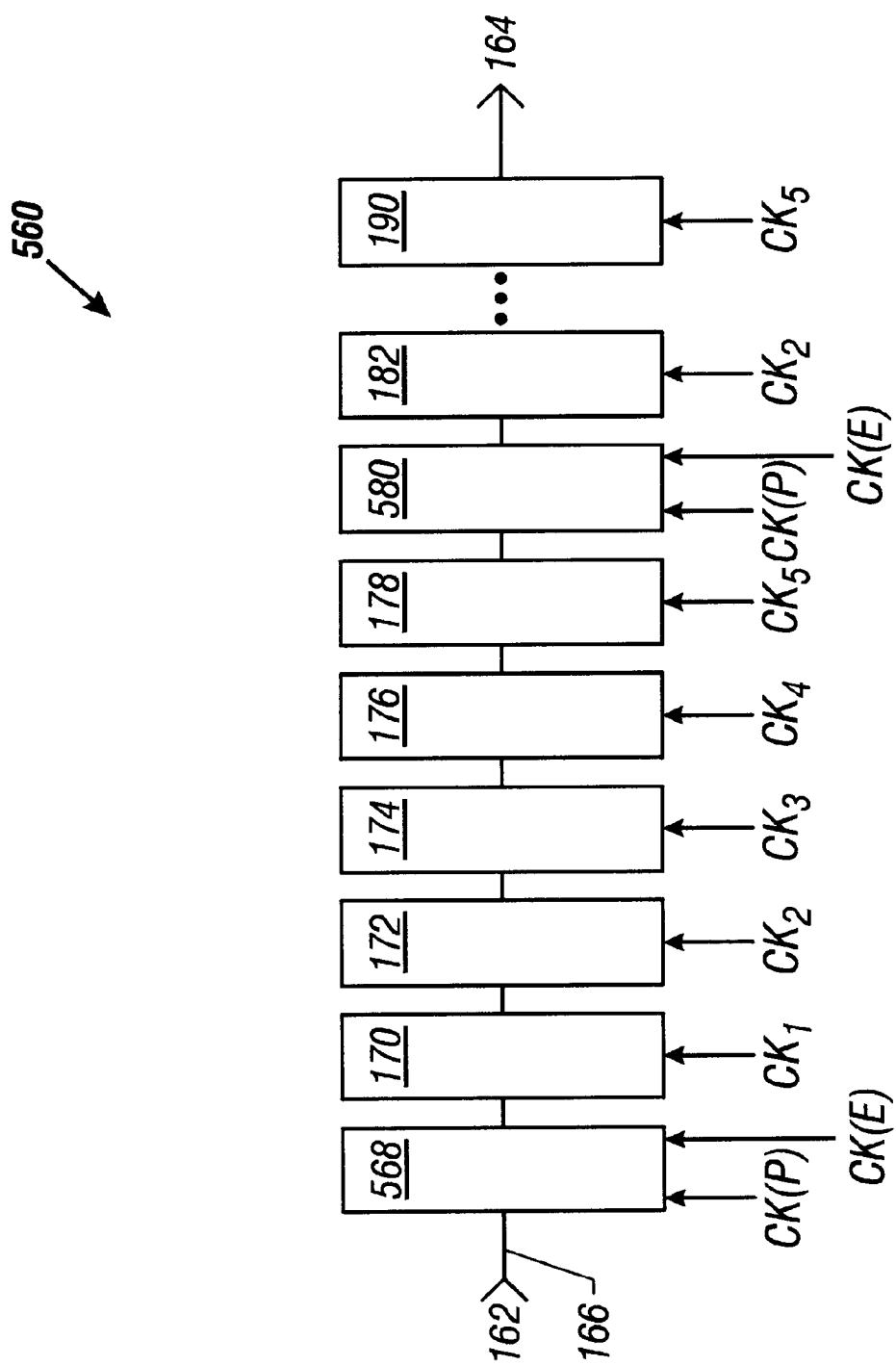
FIG. 9 shows a network of gates using a multiple phase logic synchronization system wherein all phase 0 gates are scan gates.

FIG. 9 shows a network 560 of N-NARY gates, much like FIG. 4, except that in FIG. 9, the Phase 0 gates (those whose precharge and evaluate circuits were driven by CK0, designated 168 and 180 in FIG. 4) are now designated as scan gates 568 and 580. In other words, gates 568 and 580 are scan gates in network 560 and thus include the extra scan-related components and circuitry on their output lines as shown in FIG. 8. Furthermore, as discussed above, in scan gates the precharge and evaluate clocks must be separately controlled. Therefore, the clock signal CK0 to gates 168 and 180 in FIG. 4 has been replaced with two signals, CK(P) and CK(E) in FIG. 9. In normal operation, CK(P) and CK(E) are identical to CK0, the scan related circuitry is quiescent, and the network 560 behaves the same as network 160 in FIG. 4.

Figure 10:
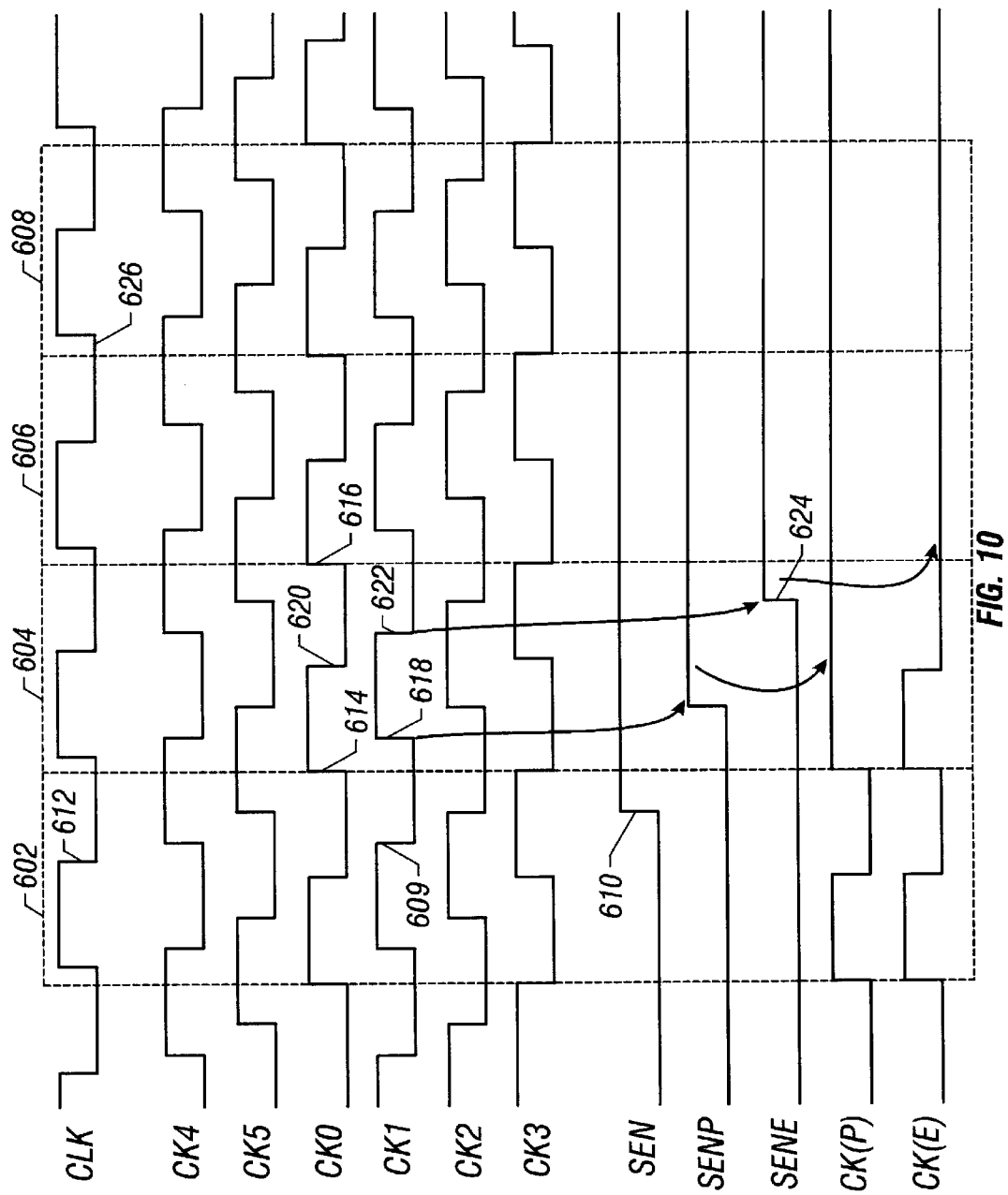
FIG. 10 shows the relationship between the logic synchronization clock control signals and the scan control signals for at-speed state capture, according to an embodiment of the present invention.

FIG. 10 illustrates the relationships between the various clock signals when a network of logic that is clocked using a six-phase logic synchronization methodology is placed into scan mode to scan the output state of the scan gates. FIG. 10 and the following text demonstrate how the output state of each scan gate can be captured when the network is running at operating speed. As noted above, the ability to capture the output state of gates that are running at operating speed is an important performance improvement over existing scan methods and architectures.

FIG. 10 shows the global clock signal, CLK, at the top, followed by the six sequentially generated overlapping clock signals CK0 through CK5 that synchronize the propagation of signals through the networked logic gates. In this embodiment, CK4, CK5, and CK0 are triggered from the falling edge of CLK, and CK1, CK2, and CK3 are triggered from the rising edge of CLK. As discussed above, CK(P) and CK(E), the two signals at the bottom of FIG. 10, start out identical to CK0. FIG. 10 shows four full Phase 0 clock cycles, designated as 602, 604, 606, and 608. As explained in further detail below, the "capture" cycle in the sequence depicted in FIG. 10 is cycle 606.

SEN is a global Scan Enable signal that is distributed through a series of latches or static registers that fan out over the design. The final level of SEN arrives at the input to the clock generation logic of all the scan gates in the design. SEN is asserted 610 at this input when the Phase 1 clock goes low 609, shortly after the master clock CLK falls 612 but before CK0 goes high at 614. The next Phase 0 high time, (616 in FIG. 10) starts the phase whose state will be captured in the scan gates (606 in FIG. 10).

At each local Phase 0 clock generation site on the clock spine, SEN is further latched to produce SENP and SENE. SENP is latched from SEN by CK1 going high at 618. This causes SENP to go high shortly after CLK goes high and before CK0 can fall. SENP is OR'ed with CK0 to produce CK(P). Therefore, when SENP goes high, CK(P) is already high because CK0 is high. However, when CK0 falls at 620, CK(P) remains high, because SENP is high.

SENE is latched from SENP by CK1 going low at 622. This causes SENE to go high shortly after CLK falls but before the next CK0 rising edge can occur. The inverse of SENE is ANDed with CK0 to produce CK(E). Thus, CK(E) is high when CK0 is high and SENE is low. When SENE is latched high at 624, CK(E) is prevented from rising again by the inverse of SENE.

Therefore, at the beginning of the capture phase 606, each Phase 0 scan gate is "frozen." SEN, SENE, and SENP are all asserted. The scan gates precharged and evaluated in the prior phase, but are prevented from precharging and evaluating again because CK(P) is latched high and CK(E) is latched low. The value on each output line of each scan gate is thus available for scan.

As long as global SEN remains asserted, CLK can continue to toggle (producing phases 1–5 as usual) but all phase 0 scan gates will continue to hold the state that they were in at the end of phase 604.

To scan the scan gates, CLK must be stopped when it is low. Stopping CLK at 626, shortly before it rises, puts the Phase 1, 2, and 3 gates in precharge and provides a quiet electrical environment for scan reading and writing.

Although not shown in FIG. 10, if the network is running at speed, those skilled in the art will recognize that the clock should ordinarily not be stopped abruptly, but rather, the clock rate should be ramped down over a number of phases to avoid overload problems caused by a large negative di/dt. Reference 626 in FIG. 10 is intended to illustrate a point when CLK, CK1, CK2, and CK3 are all low, corresponding to the precharge state for Phase 1, 2, and 3 gates. Those skilled in the art will recognize that stopping the clock abruptly at 626, one clock cycle after freezing the output state of the scan gates, would likely cause di/dt problems.

When CLK is stopped, the scan registers can be read and the state of the scan gate outputs can be determined. Additionally, if desired, the state of the scan gate outputs can be modified by writing to the scan gates from the scan registers.

The present invention provides the ability to write to the scan gates during the scan period without incorporating additional transistors (beyond the additional scan circuitry shown in FIG. 8) into the scan gates' structure. To write to a selected row of scan gates, the scan gates are first precharged and then conditionally discharged via the scan write transistors 400. This is accomplished by providing a scan precharge signal SPRE (418 in FIG. 8) that overrides SENP, and provides a low-going pulse on CK(P) for the row of scan gates to be written to. (Recall that SENP is ordinarily high during scan periods, keeping CK(P) high and preventing the scan gates from precharging normally.)

If continued operation is desirable, the CLK can be restarted. To continue at operating speeds, CLK must be ramped up over a number of cycles, this time to avoid source the creation of undesired speed paths due to large di/dt. When CLK is started again, the Phase 1–5 clocks will resume toggling, and the state of the Phase 0 scan gates (whether they have been modified by writing to them during scan or not) will propagate through the Phase 1–5 gates. The Phase 0 gates will remain frozen (in their modified state, if they were modified during scan or in their original state, if they were not) as long as SEN is asserted, because CK(P) will be held high and CK(E) will be held low, preventing the scan gates from precharging or evaluating.

To exit scan mode, SEN is deasserted. This causes SENP to fall when CK1 rises due to the rise of CLK. Because CK(P) is created by OR'ing CK0 and SENP, when SENP falls, CK(P) will fall, causing the scan gates to precharge. Similarly, after SEN is deasserted, SENE will fall after the next CK1 falling edge, shortly after the master clock CLK falls. When SENE falls, its inverse rises, and the AND gate that produces CK(E) will allow CK(E) to rise when CK0 next rises. At this point, CK(P) and CK(E) are re-synchronized with CK0, and the Phase 0 scan gates return to normal operation, precharging and evaluating every clock cycle.

Figure 11:
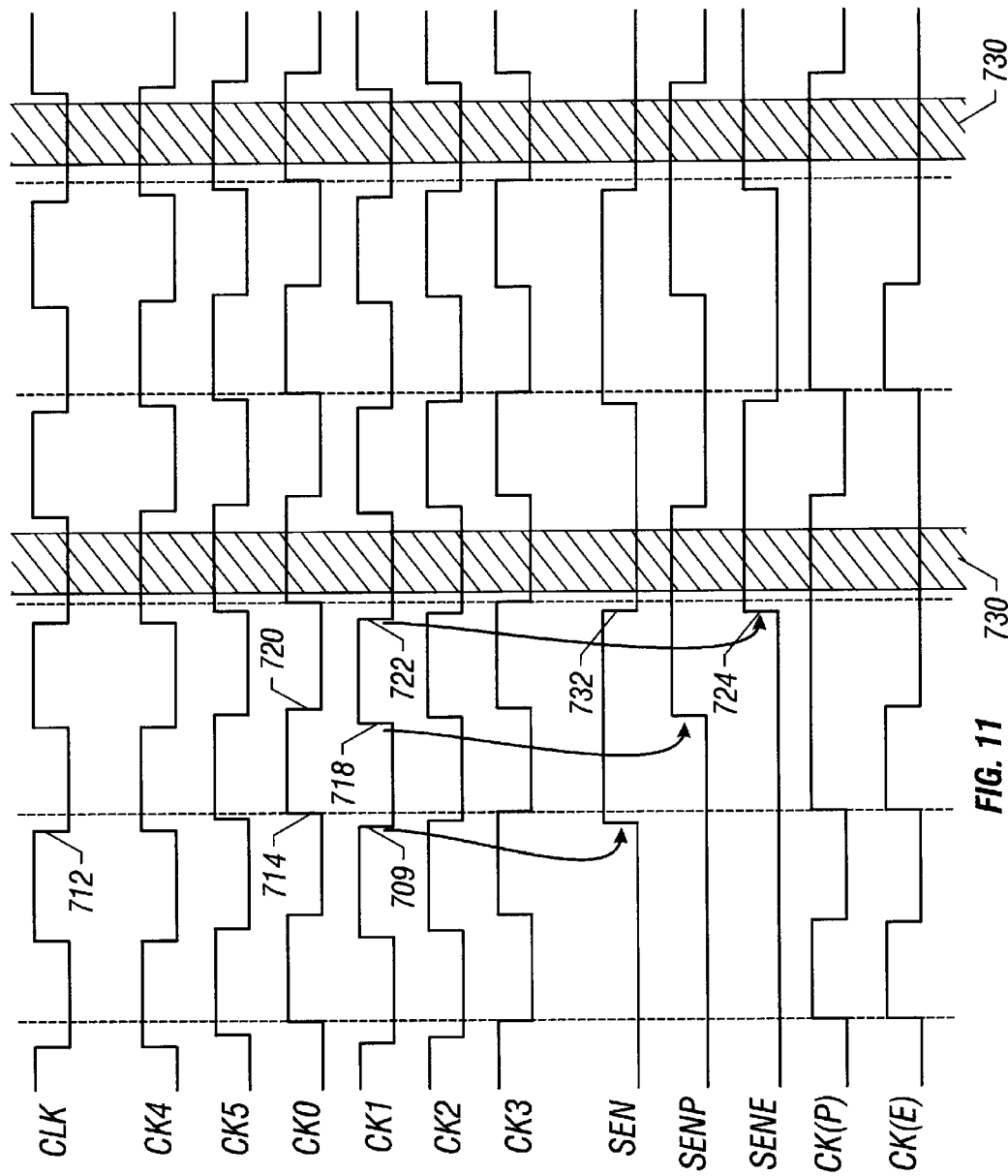
FIG. 11 shows the relationship between the logic synchronization clock control signals and the scan control signals for single-stepped or slow-clock scan mode, according to an embodiment of the present invention.

FIG. 11 illustrates the relationships between the various clock signals when "stepping through" operations, as might occur when the scan gates are read or written to at each step. This single-step mode of operation is most useful for examining or troubleshooting specific areas in the logic, and for loading and executing test vectors. In this mode, the master clock CLK toggles very slowly and irregularly. For convenience only, FIG. 11 shows CLK and its various derivative clocks as symmetrical, but in reality, the shaded region (where CLK is low during scan) will be a much longer period of time than other parts of the waveform. In addition, since CLK in this mode is very slow compared to normal operation, the delay between CLK's rising edge and the rising edges of CK1–CK3 and failing edges of CK4–CK0 (all generated from CLK's rising edge) is not as pronounced in FIG. 11 as in FIG. 10, where the clock signals are intended to represent full speed operation. The same is true regarding the derivative clocks CK(P) and CK(E) and the other CLK-related signals SENE and SENP.

In single step operation, SEN is toggled every clock cycle. SEN goes high at the input to the scan gates' clock generation logic when the Phase 1 clock goes low at 709, shortly after the master clock CLK falls 712 but before CK0 goes high at 714. As in full speed operation, SENP is latched from SEN by CK1 going high at 718. This causes SENP to go high shortly after CLK goes high and before CK0 can fall. Again as in full speed operation, when SENP goes high, CK(P) is already high because CK0 is high. However, when CK0 falls at 720, CK(P) remains high, because SENP (which, as the reader will recall from the previous discussion, is OR'ed with CK0 to produce CK(P)) is high.

SENE is latched from SENP by CK1 going low at 722. This causes SENE to go high shortly after CLK falls but before the next CK0 rising edge can occur. Because the inverse of SENE is ANDed with CK0 to produce CK(E), CK(E) is high when CK0 is high and SENE is low. When SENE is latched high at 724, CK(E) is prevented from rising again by the inverse of SENE.

Reading and optional writing of the state of the scan gates can now occur (the shaded regions 730 on FIG. 11). As discussed above, the duration of the scan periods 730 will be much longer than implied by the clock signals depicted in FIG. 11. In single step operation, during the scan periods 730, the clock is either stopped completely or is running very slowly to provide sufficient time to read the scan registers or load test vectors.

As shown in FIG. 11, SEN is deasserted at 732, just after the Phase 1 clock goes low at 722, but prior to the first shaded scan period 730. SENE and SENP stay high during the scan period (recall that SENP is latched by a Phase 1 high clock, and SENE is latched from SENP. When CLK is stopped during the scan period 730, CK1 stays low. Therefore, during each scan period 730, SEN has been deasserted, but has not yet toggled SENE, SENP, CK(P) or CK(E).

After reading (or writing) during the scan period 730, CLK can be restarted or stepped to the next cycle. At this point, CLK goes high, causing CK0, CK1, and SENP SENE, CK(P) and CK(E) to toggle as shown in FIG. 11 and as described above in connection with full-speed operation. After the next falling CLK and CK1, SEN is again asserted, and the process repeats again as shown in FIG. 11. Therefore, in single step or slow clock operation, scan gates can be read or written to every second clock cycle. This allows logic to propagate from a Phase 0 gate through the rest of the gates before the next scan cycle.

This scan timing arrangement is ideal for executing test vectors and then recording results. This is accomplished by reading a scan gate's output state during a scan period 730 and then writing an input vector to the gate. The clock is then restarted, and the vector propagates state through the Phase 1–5 gates to the next Phase 0 scan gate. The clock is then stopped for the next scan period, and the output state of that gate read and compared to the expected result.

Figure 12:
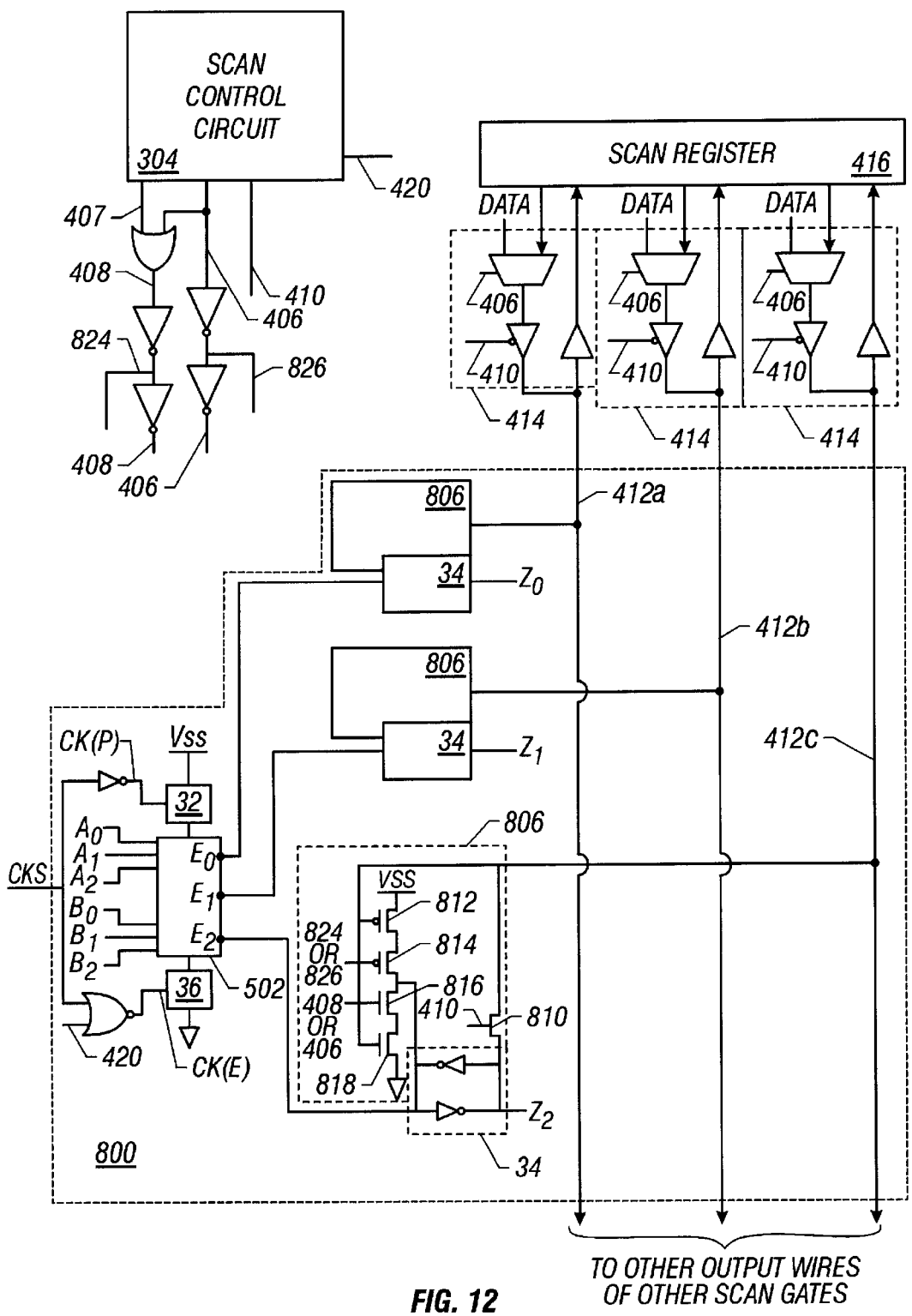
FIG. 12 shows another embodiment of the scan architecture used in the present invention.

FIG. 12 shows an alternative embodiment of scan gate 500, designated 800. FIG. 12 is similar to FIG. 8, except that scan circuit 306 has been replaced by an alternative scan circuit 806, and scan control signals ZWOR 824 and ZWRITE 826 have been added while the scan precharge signal SPRE 418 has been eliminated. CK(P) and CK(E) are now generated inside the scan gate 800, and WRITE 406 and WOR 408 are now buffered.

As shown in FIG. 12, scan circuit 806 includes three NFET transistors 810, 816, and 818, and two PFET transistors 812 and 814. When the read signal 410 is high, read transistor 810 conducts and the state of the output signals $Z_0$, $Z_1$, and $Z_2$ is provided to the scan register 416 through scan data lines 412a, 412b, and 412c.

When WRITE 406 is high, ZWRITE 826 is low, and both write transistors 814 and 816 conduct. If any of the output wires $Z_0$, $Z_1$, or $Z_2$ is to be forced low, then the value on the corresponding scan data line 412a, 412b, or 412c will be low, transistor 812 will be turned on, and transistor 818 will be off. Transistor 812 will discharge through transistor 814 to the evaluate node and the output buffer 34 will invert the high value such that the value on the output line is low.

Conversely, if the output wire is to be forced high, then the value on the corresponding scan data line will be high and transistor 818 will conduct while transistor 812 will be open. The evaluate node will be connected to ground through transistors 816 and 818, and the output buffer 34 will invert the low to a high outgoing signal on the output wire. Those skilled in the art will recognize that the scan write architecture shown in FIG. 12, in particular the tri-state inverter, eliminates the need to precharge the gate to drive high evaluate nodes to a low state. Consequently, SPRE 418 is no longer needed.

As was the case previously in scan gate 500, one and only one output line of an N-NARY scan gate 800 is connected to a scan circuit 806 wherein the gate of the write transistors couples to the write-or-reset signal WOR 408. In the embodiment shown in FIG. 12, WOR 408 has an inverse, ZWOR 824. These signals operate with the write transistors 814 and 818 to write to the gate, and to reset the system, as described previously.

While FIG. 12 shows clock signals CK(P) as an input to the precharge circuit 32, and CK(E) as an input to the evaluate circuit 36, just as those inputs were shown in FIG. 8, these clock signals to the precharge circuit 32 and evaluate circuit 36 are now generated inside of scan gate 800, rather than at the gate's clock generation site on the clock spine. Therefore, scan gate 800 has only a single clock input, CKS, that is the same as CK3, which is basically an inverted version of CK0, as shown in FIGS. 10 and 11. CKS enters scan gate 800 and is inverted to precharge the logic tree 502. CKS is also NOR'ed together with SEN 420 to produce CK(E). Therefore, when CKS is high, (corresponding to the same time that CK0 is low) CK(P) is low and the logic tree 502 precharges. CK(E) is also low. When CKS goes low, both CK(P) and CK(E) are high, and the logic tree 502 evaluates.

In scan mode, when SEN 420 is enabled or high, CKS and CK(P) will continue to cycle between high and low, but CK(E) will always stay low, and the logic tree 502 will never evaluate. When SEN 420 is deasserted, CK(E) will resume cycling according to CKS.

Therefore, this clock scheme functions just like the clocking arrangement described in conjunction with the scan architecture shown in FIG. 8 and the clock signals shown in FIGS. 10 and 11, except that in this clocking arrangement, neither SENE nor SENP are needed or generated.

Figure 13:
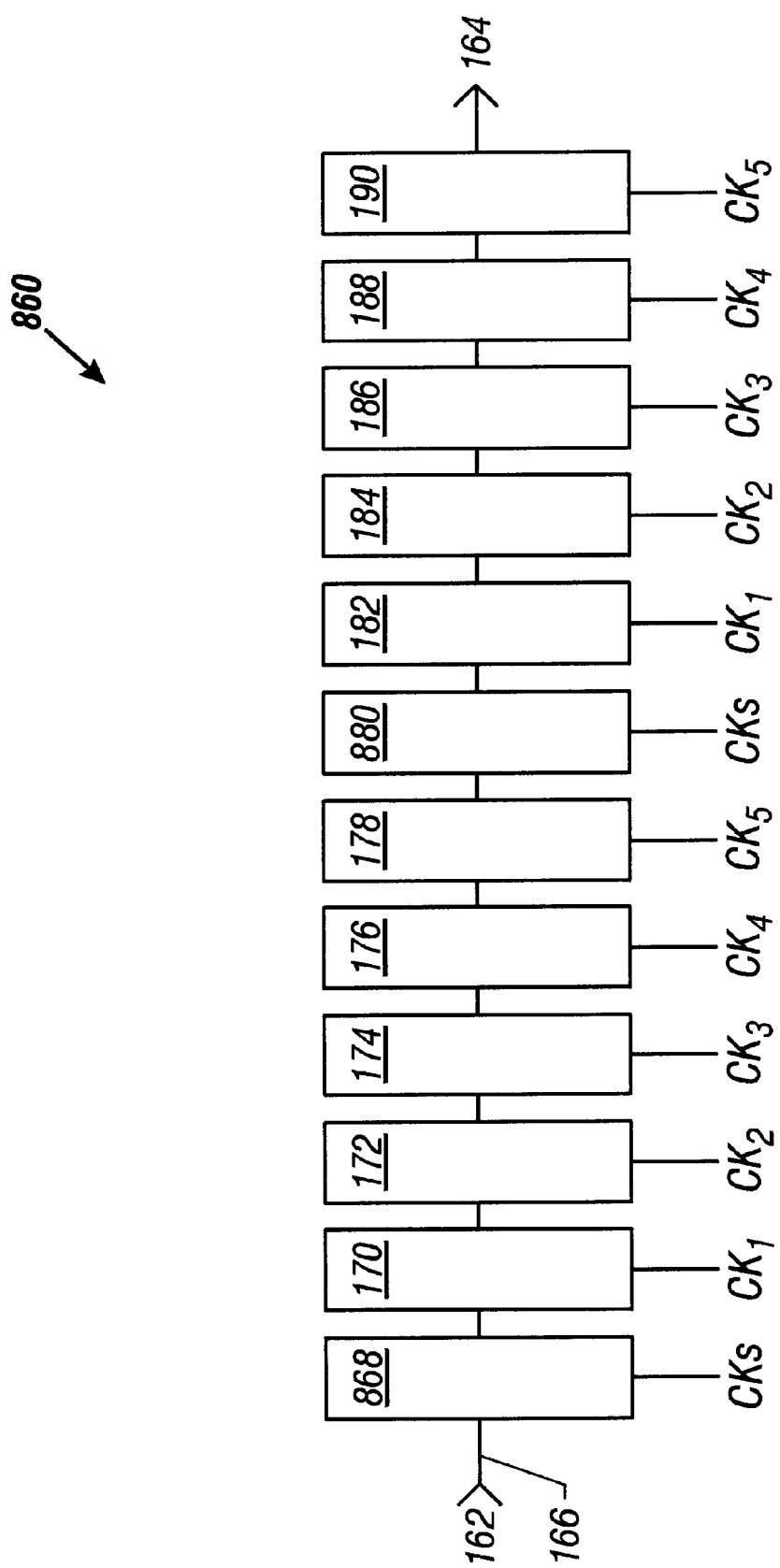
FIG. 13 shows a network of gates using a multiple phase logic synchronization system wherein all phase 0 gates are scan gates, according to the second embodiment of the present invention.

FIG. 13 shows two scan gates embedded in a network of dynamic logic. FIG. 13 is similar to FIG. 9, except that in FIG. 13, network 860 includes scan gates 868 and 880, which are implemented in the alternative embodiment 800 shown in FIG. 12. Accordingly, the clock inputs to the scan gates (CK(P) and CK(E) in FIG. 9) have been replaced by CKS.

Those skilled in the art will recognize that the architecture and clocking arrangement shown in FIG. 12 has some advantages over that shown in FIG. 8. First, the scan gate clock generation is simpler. This provides layout and floor-planning advantages. Moreover, decoupling the scan logic from the Phase 0 clock generation sites facilitates the use of 64-bit virtual scan rows, which may comprise less than one or more than several physical rows, depending upon the scannable bit population of each physical row. Also, the distribution of SEN over the design no longer needs to be synchronous and high-speed.

However, the architecture and clocking arrangement shown in FIG. 12 only allows for the at-speed capture of the state of the scan gates if the design can tolerate the power supply overshoot caused by a high negative di/dt. In this embodiment, CK(P) will continue to toggle as long as CKS toggles. Therefore, to capture a certain output state, CKS must be stopped abruptly to prevent CK(P) from precharging the logic tree and destroying the output state of the scan gate.

Figure 14:
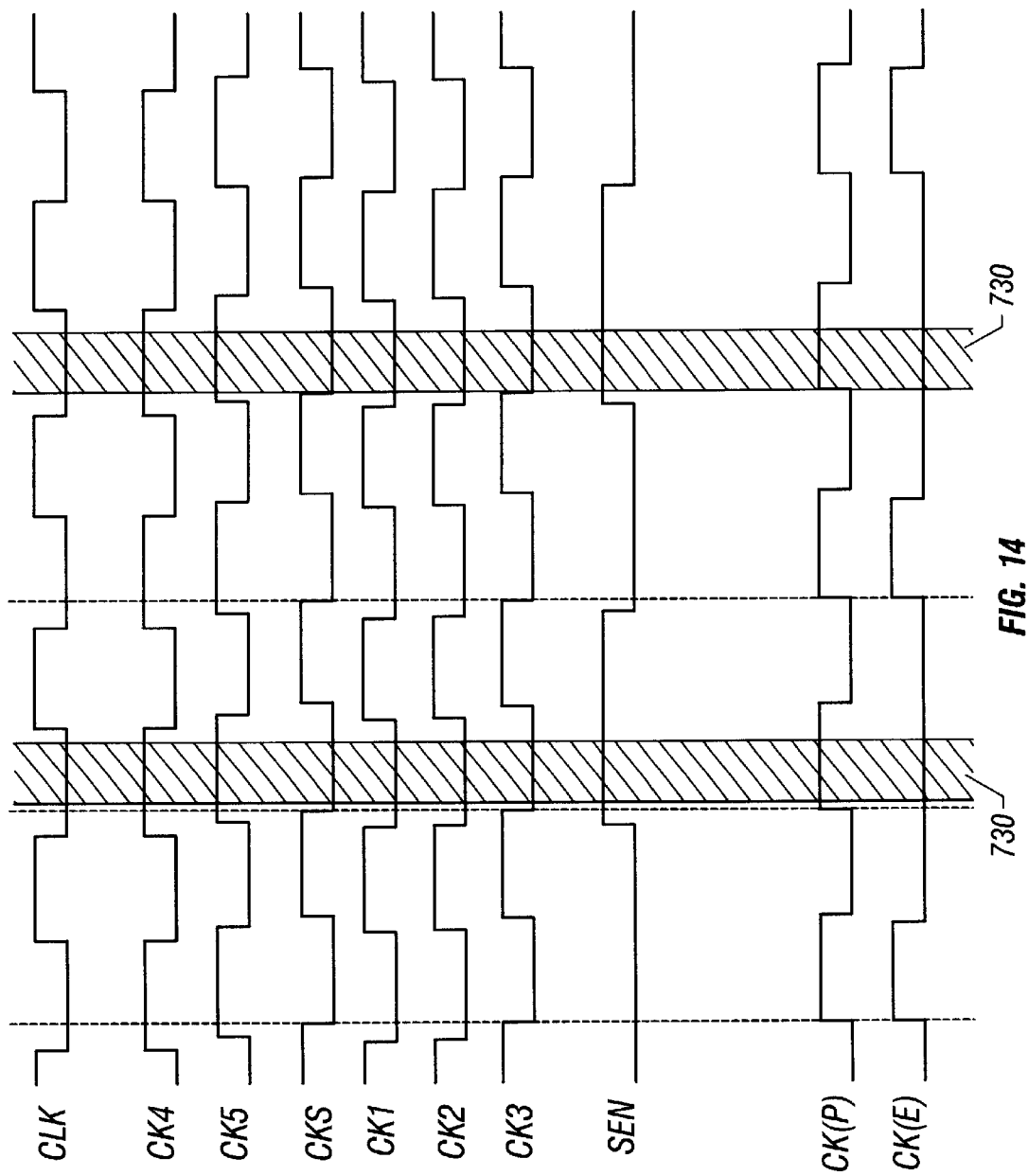
FIG. 14 shows the relationship between the master clock, the logic synchronization clock signals, and the scan control signals for scan according to the second embodiment of the present invention.

The FIG. 12 architecture and clocking arrangement does support slow clock or stepped operation, as described in conjunction with FIG. 11, although the behavior of CK(E) is slightly different, as shown in FIG. 14.

FIG. 14 depicts the operation of the clocks relative to each other during stepped operation scan using the scan architecture shown in FIG. 12. Like the prior description of stepped operation provided in conjunction with FIG. 11, the duration of the scan periods 730 will be much longer than implied by the clock signals depicted in FIG. 14. In single step operation, during the scan periods 730, the clock is either stopped completely or is running very slowly to provide sufficient time to read the scan registers or load test vectors. Likewise, as described previously, the scan periods 730 occur every second clock cycle, when the master clock and the Phase 1, 2, and 3 are low, thus providing a quiet electrical environment for reading and writing to the scan gates.

CLK and the Phase 1–5 clocks are identical to the CLK and Phase 1–5 clocks shown and described in FIG. 11. However, the "Phase 0" reference clock shown in FIG. 11 has been replaced, in FIG. 13, with the CKS signal that is the clock signal input to the scan gate 800.

FIG. 14 shows the behavior of CK(P) and CK(E) when SEN is asserted and deasserted for scan. As shown in FIG. 14, CK(P) is an inverted version of CKS, and continues to toggle as CKS toggles. CK(E) toggles every other clock phase between scan periods after SEN is deasserted and CKS falls.

Figure 15:
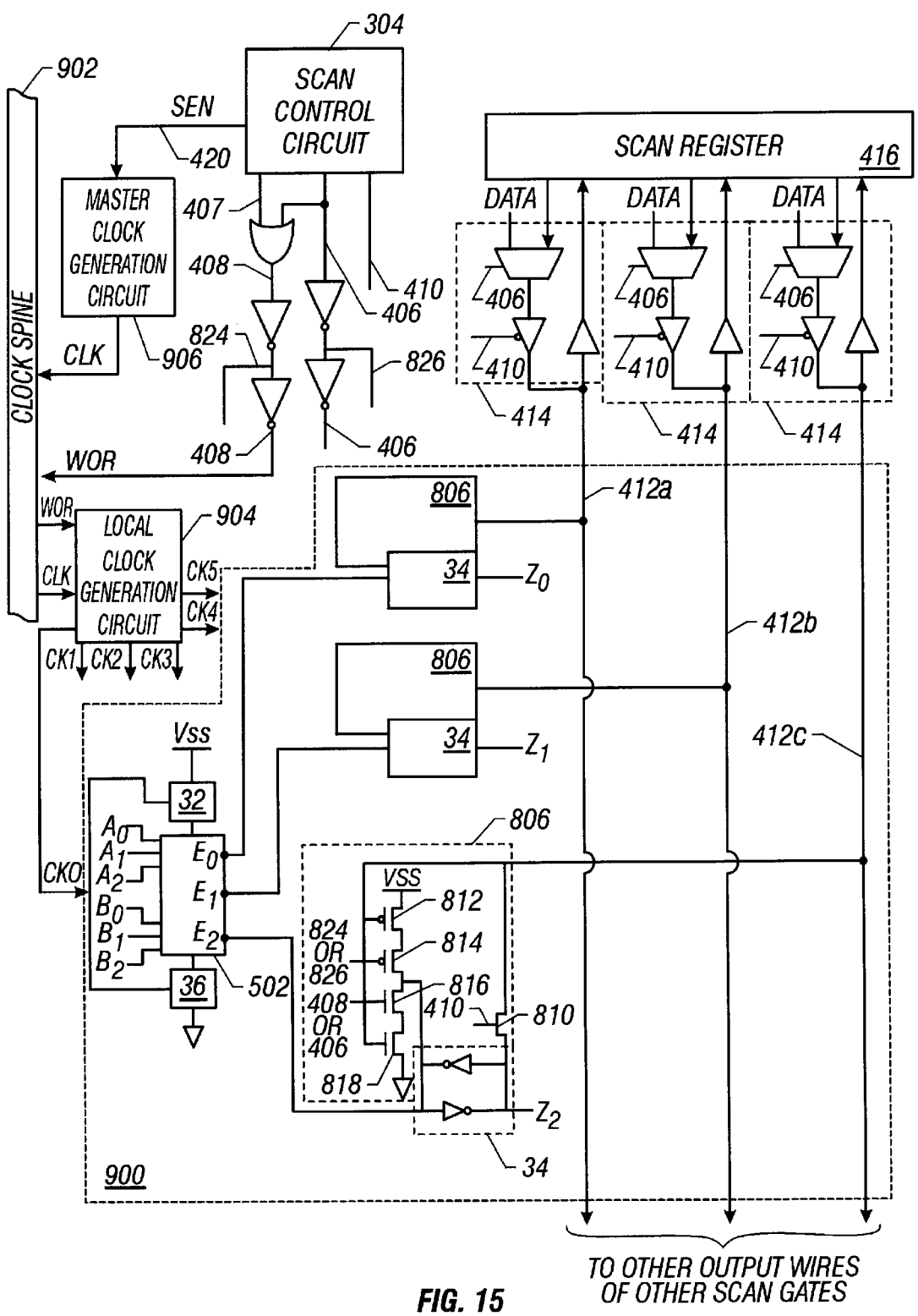
FIG. 15 shows another embodiment of the scan architecture used in the present invention.

FIG. 15 shows another embodiment of scan gate, designated 900, along with the same scan control circuit 304, scan register 416, and read/write drivers 414 shown and described previously. FIG. 15 also shows the master clock generation circuit 906 that generates the master clock signal, CLK, which is provided to the clock spine 902. As shown in FIG. 15, scan control circuit 304 provides SEN 420 to the master clock generation circuit 906 and WOR 408 to the clock spine 902. Local clock generation circuit 904 receives CLK from the clock spine 902 and generates the sequentially generated logic clock signals CK0 through CK5. In this embodiment, the local clock generation circuit 904 also receives WOR 408 from the clock spine, which controls the operation of some of the sequentially generated logic clock signals during the write process, as explained in further detail below.

The scan gate 900 shown in FIG. 15 is identical to scan gate 800 shown in FIG. 12, except that in this embodiment, the clock input to scan gate 900 is one of the sequentially generated logic clock signals generated by the clock generation circuit 904 that is used to time and synchronize all the logic circuitry in the design, rather than a special clock signal generated solely for scan. In the example scan gate 900, the logic clock signal input is CK0. However, those skilled in the art will recognize that designers could designate gates other than phase 0 gates as scan gates without departing from the present invention. For example, a designer could designate some or all of the phase 3 gates—gates that receive the CK3 logic clock signal—as scan gates, rather than the phase 0 gates as described herein. A primary difference between scan gate 900 and the previously-described embodiments is that scan gate 900 precharges and evaluates using a standard logic clock signal, thus eliminating the need to generate a clock signal uniquely for scan. Scan gate 900 includes the same scan circuits 806 as described in the previous embodiment, and therefore, like scan gate 800, scan gate 900 does not need to be precharged before writing to it in scan mode. In addition, as described in more detail below, the logic synchronization clock scheme can be implemented so as to further eliminate any need to precharge scan gate 900 for scan writing.

As shown in FIG. 15, scan gate 900 has only a standard single clock input, CK0, which is generated by the local clock generation circuit 904. Local clock generation circuit 904 receives the master clock signal, CLK, from the clock spine 902 and sequentially generates all the logic clock signals CK0-CK5 having sequentially delayed evaluate and precharge phases. In a standard operating mode, CK0 enters the scan gate 900 from the clock generation circuit 904 and precharges the logic tree 502 when it is low and evaluates the logic tree 502 when it toggles high.

The local clock generation circuit 904 generates the sequentially generated logic clock signals by buffering and delaying CLK. CK0, CK1, and CK2 transition with CLK's edge, sequentially delayed in the order listed. CK3, CK4, and CK5 transition opposite CLK's edges, again sequentially delayed in the order listed. The arrangement and behavior of the sequentially generated logic clock signals during regular operation and during scan modes is shown and described below, in connection with FIGS. 16 and 17.

To enter scan mode, SEN 420 is asserted and stops CLK high. After sequential delays, CK0, CK1, and CK2 will be stopped high, while CK3, CK4, and CK5 will be stopped low. To write to the scan gates, all logic clock signal inputs to gates "downstream" of the scan gates that are high when CLK is stopped must be forced low, to force these downstream gates into a precharge mode. In a sequentially clocked precharge logic network that uses a multiple overlapping clock phase scheme such as that described herein and in the Logic Synchronization patent, forcing the downstream gates into precharge effectively clears preexisting state information from the input lines of these gates, thus ensuring that the downstream gates are ready to receive, as inputs, the test vector being written to the output lines of the phase 0 scan gates and the results of that test vector as it propagates through the gates along the datapath. Failing to clear out state information on the inputs to downstream gates could result in errors or invalid inputs to the downstream gates. Since CK5 will be low when the clocks are stopped, the gates immediately upstream of the scan gates are in precharge, causing the input lines to the scan gates to be clear even though the scan gates are in the evaluate state.

As described above, a common approach to circuit testing using scan is to stop the clock, write a test vector to one or more scan gates, start the clock and let the test vector propagate through the logic to the next downstream scan gate, stop the clock again, read the output state of the downstream scan gate, and compare it with the expected output state, given the value of the input test vector and the functionality of the gates between the two scan gates. However, if the inputs to any of the gates between the two scan gates are not cleared properly and contain stale state information, the output at the downstream scan gate on the next read may not conform to expected results, implying a circuit error where none may exist.

To write to the scan gates, WRITE 406 is asserted, causing WOR 408 to go high, and ZWRITE 826 and ZWOR 824 to go low. Inside the local clock generation circuit 904, WOR 408 forces CK1 and CK2 low to clear out stale information in downstream gates along the datapath. While CLK is stopped, CK1 and CK2 need not be controlled with standard clock signal precision; all that is required is that they be low during the write process and then returned to high after the write, to correctly pass data after CLK is restarted. Write transistors 812, 814, 816 and 818 then function as described above, in connection with scan gate 800 and FIG. 12, and the write proceeds. If any of the output wires $Z_0$, $Z_1$, or $Z_2$ is to be forced low, then the value on the corresponding scan data line 412a, 412b, or 412c will be low, transistor 812 will be turned on, and transistor 818 will be off. Transistor 812 will discharge through transistor 814 to the evaluate node and the output buffer 34 will invert the high value such that the value on the output line is low.

Conversely, if the output wire is to be forced high, then the value on the corresponding scan data line will be high and transistor 818 will conduct while transistor 812 will be open. The evaluate node will be connected to ground through transistors 816 and 818, and the output buffer 34 will invert the low to a high outgoing signal on the output wire.

If the phase 0 scan gate is to be read instead of written to, there is no need to force CK1 and CK2 low. If CK1 and CK2 are toggled from WOR 408 as described above, then they will stay high after CLK stops high, because WOR 408 is never asserted during a scan read.

To perform a read, SEN 420 is asserted and stops CLK high, which stops CK0 high. READ 410 is asserted, read transistor 810 conducts and the state of the output signals $Z_0$, $Z_1$, and $Z_2$ is provided to the scan register 416 through scan data lines 412a, 412b, and 412c.

Figure 16:
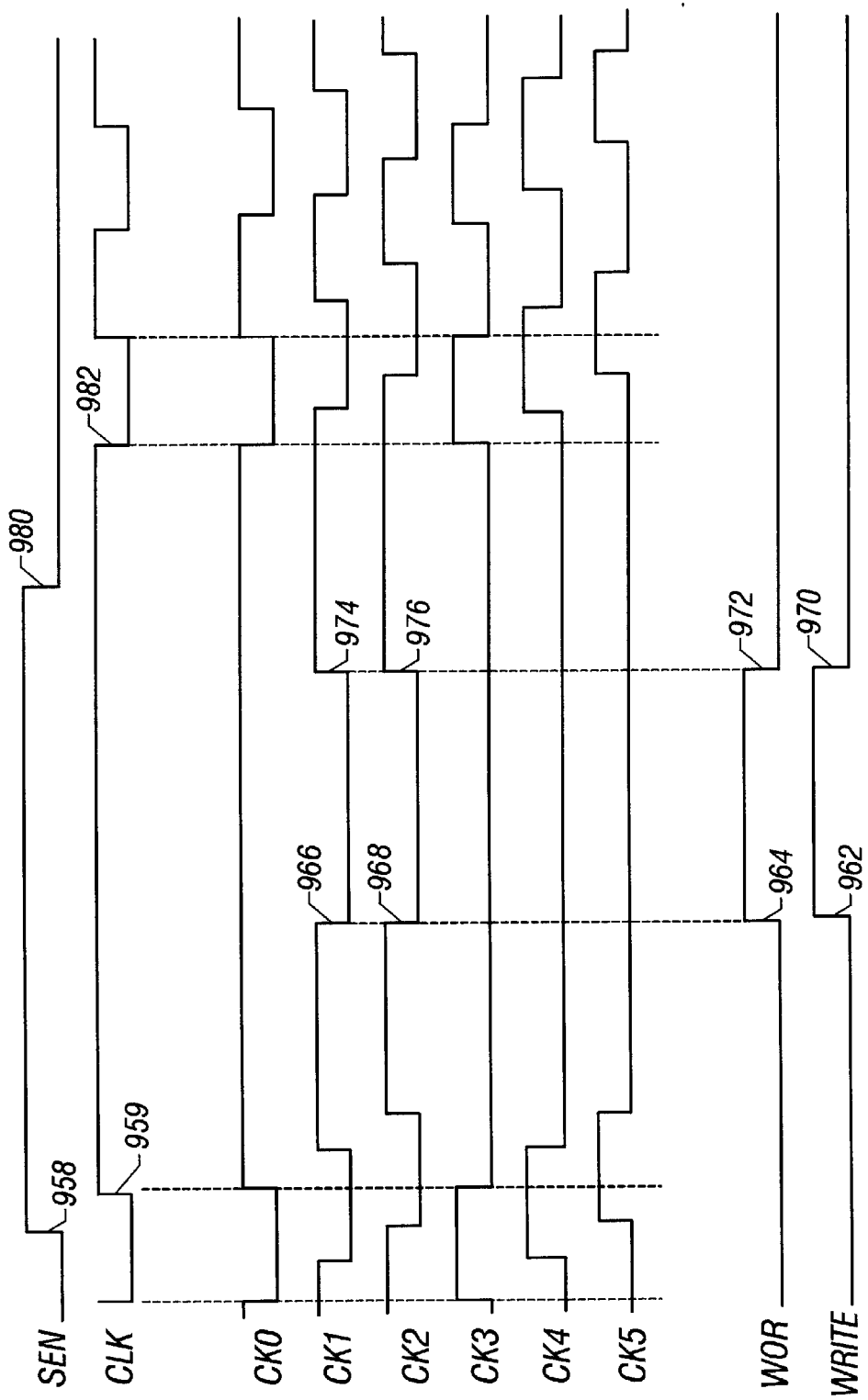
FIG. 16 shows the relationship between the master clock, the sequentially generated logic clock signals, and the scan control signals during the scan write process, according to the third embodiment of the present invention.

FIG. 16 illustrates the relationships between the sequentially generated logic clock signals during a scan write using this embodiment of scan gate 900 and a six-phase logic synchronization methodology where the phase 0 gates are the scan gates. FIG. 16 shows the global clock signal, CLK, followed by the six sequentially generated overlapping clock signals CK0 through CK5 that synchronize the propagation of signals through the networked logic gates via the clock spine. In this embodiment, CK0, CK1, and CK2 fall after CLK falls, and CK3, CK4, and CK5 rise after CLK falls. Also, in FIG. 16, the network of synchronously clocked precharge logic gates is assumed to be originally in normal, at speed operation.

As previously described, SEN is the global Scan Enable signal that is distributed through a series of latches or static registers that fan out over the design. To write to the scan gates, SEN is asserted 958. This causes CLK to stop after its next rising edge, shown on FIG. 16 at 959, which also stops all the sequentially generated logic clocks. The WRITE signal is then asserted at 962, which asserts the WOR signal at 964, which in turn forces CK1 and CK2 low at 966 and 968, respectively. At this point, the write proceeds as described above, after which WRITE is deasserted at 970, deasserting WOR at 972 and toggling CK1 and CK2 high at 974 and 976, respectively. SEN is deasserted at 980 to restart CLK. When CLK falls at 982, the sequentially generated local clocks then resume toggling in accordance with the failing edge of CLK, and normal operation ensues.

Figure 17:
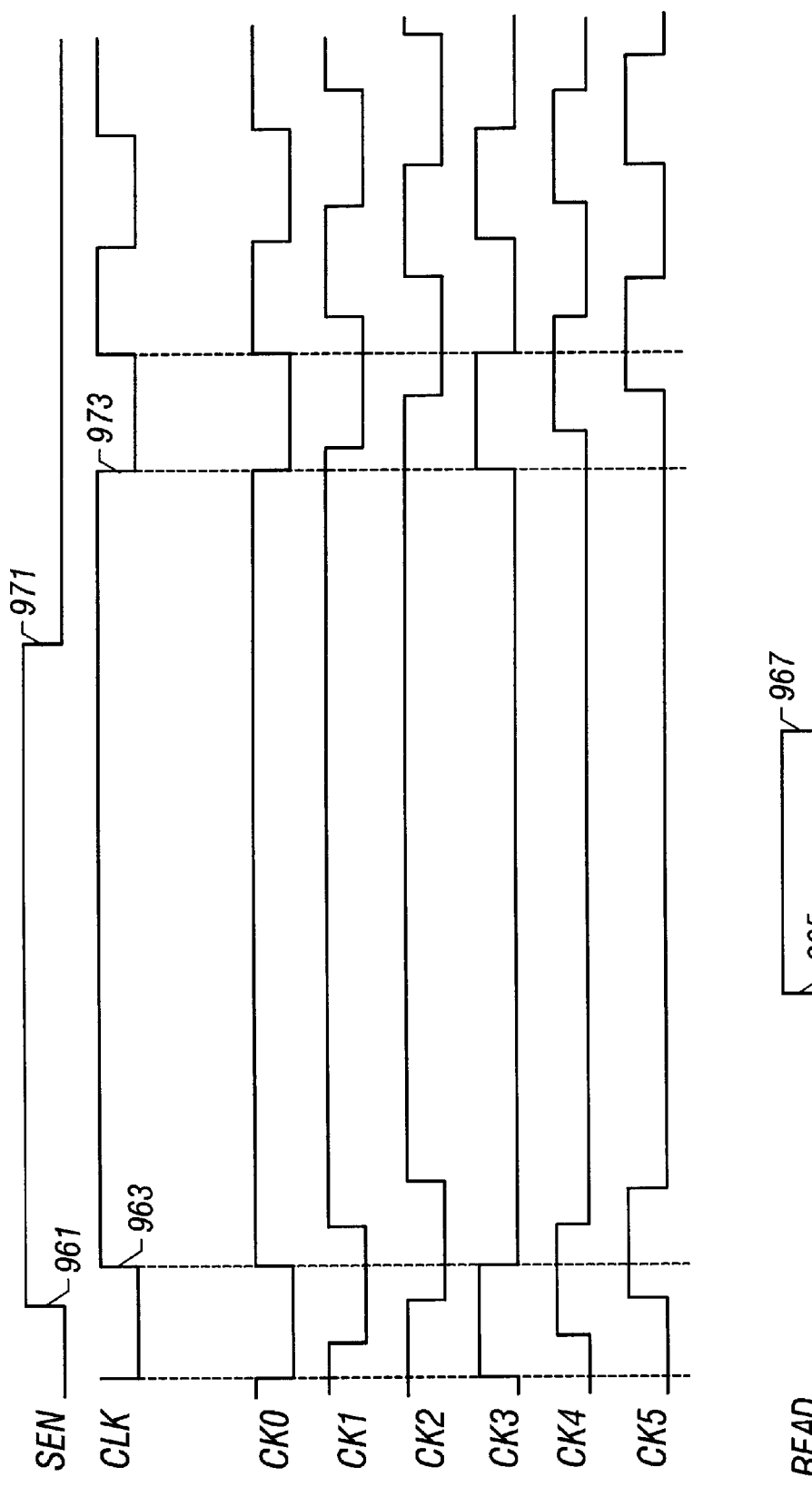
FIG. 17 shows the relationship between the master clock, the sequentially generated logic clock signals, and the scan control signals during the scan read process, according to the third embodiment of the present invention.

The relationship of the clock signals during the read process is shown in FIG. 17. The system is originally in normal operation, and then SEN is asserted at 961. Thereafter, CLK stops after its next rising edge, shown on FIG. 17 at 963. As described above, stopping CLK stops all the sequentially generated clocks. READ is asserted at 965, the read proceeds as described above, and READ is then deasserted at 967. SEN is deasserted at 971 to restart CLK, and again, the sequentially generated logic clock signals resume toggling in normal operation upon the falling edge of CLK at 973.

Figure 18:
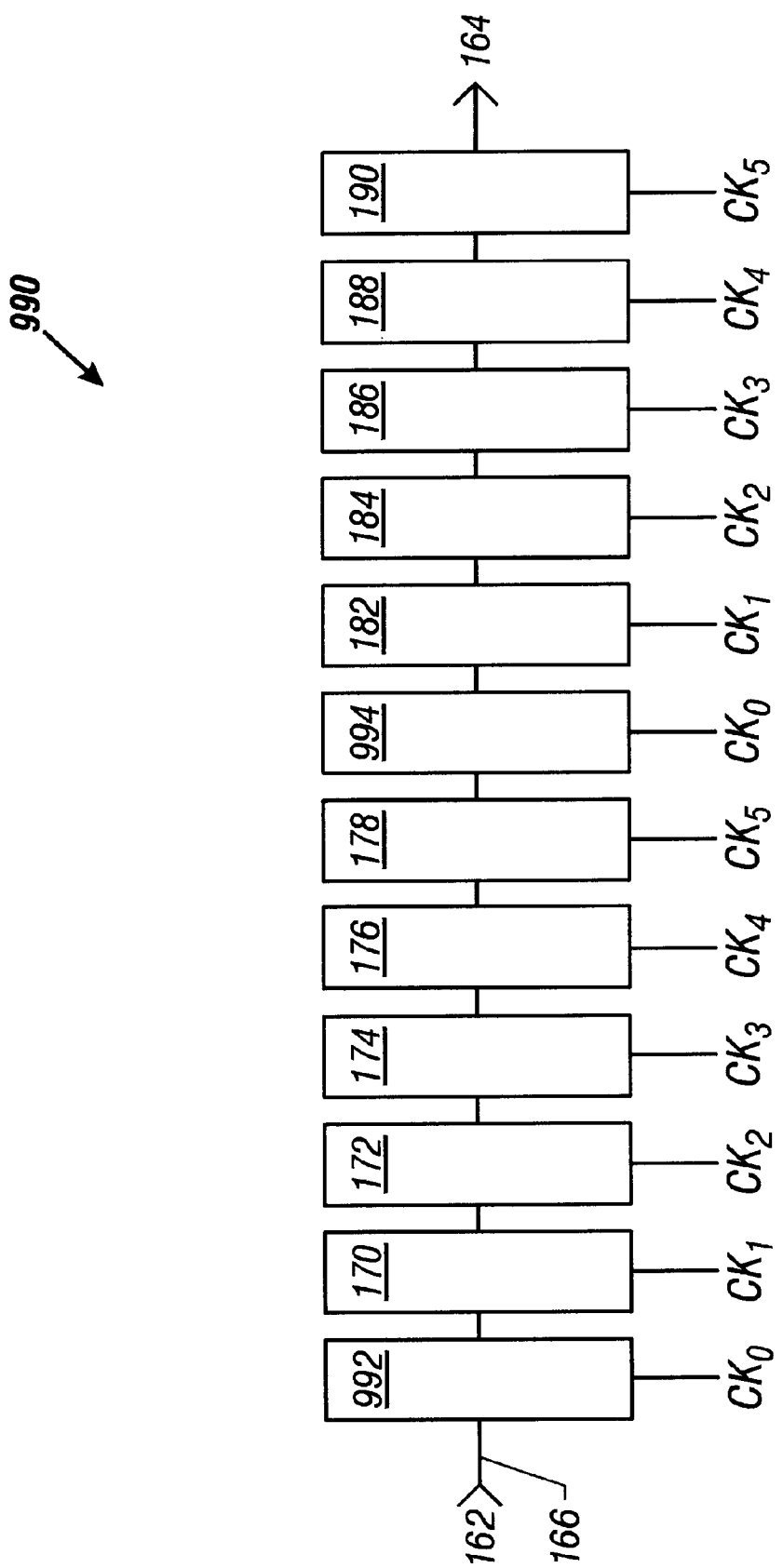
FIG. 18 shows a network of gates using a multiple phase logic synchronization system wherein all phase 0 gates are scan gates, according to the third embodiment of the present invention.

FIG. 18 shows two scan gates embedded in a network of dynamic logic. FIG. 18 is similar to FIGS. 9 and 13, except that in FIG. 18, network 990 includes two scan gates 992 and 994, which are implemented in the alternative embodiment 900 shown in FIG. 15. Accordingly, the clock inputs to the scan gates (CK(P) and CK(E) in FIG. 9, and CKs in FIG. 13) have been replaced by CK0.

Those skilled in the art will recognize that, as with the alternative embodiments described above, stopping the clocks abruptly can cause di/dt problems if the design is running at speed. The architecture and clocking arrangement shown in FIGS. 15 and 16–17 therefore only allows for the at-speed capture of the state of the scan gates if the design can tolerate the power supply overshoot caused by a high negative di/dt. In this embodiment, CK0 will continue to toggle as long as CLK toggles. Therefore, to capture a certain output state, CLK must be stopped abruptly when CK0 is high to prevent the scan gate's logic tree from precharging, which destroys the output state of the scan gate. If this embodiment is used in a sequentially clocked precharge logic network that cannot tolerate abruptly stopping the clocks when the logic is running at speed, the clocks can be slowed or stepped, and then stopped as described above when the user is ready to capture the output state of the scan gates or write to the scan gates, without creating a problem.

To summarize, the present invention comprises a method and apparatus for scan of dynamic or N-NARY clocked precharge logic circuits that include a logic tree with one or more evaluate nodes, a precharge circuit, an evaluate circuit, one or more output buffers, and one or more scan circuits, where the logic circuit receives one or more input signals and a clock signal having an evaluate phase and a precharge phase, and produces one or more output signals. The present invention includes a scan control circuit that generates scan control signals including a scan enable signal, one or more scan registers, and one or more read/write drivers coupled to the scan control circuit, the scan register, and the output buffers such that when the scan circuit receives scan control signals, the state of the output signal is provided to the scan register, or alternatively, the state of the output signal can be forced to a state specified by information in the scan register.

The present invention further comprises a network of multiple sequentially clocked precharge logic gates, wherein the input signals of a gate that receives a particular sequentially generated logic clock signal couple to a first sequentially clocked precharge logic gate that receives the immediately preceding sequentially generated logic clock signal, and the output signals of the gate that receives the particular sequentially generated logic clock signal couple to a second sequentially clocked precharge logic gate that receives the immediately following sequentially generated logic clock signal. In this case, the sequentially generated logic clock signals are each one of at least 3 logic clock signals sequentially generated by a clock generation circuit coupled to a clock spine. The sequentially generated logic clock signals are generated with a sequential delay, such that the evaluate phase of a particular logic clock signal overlaps the evaluate phase of the immediately preceding logic clock signal by approximately the same amount of time that the evaluate phase of the particular logic clock signal phase overlaps the evaluate phase of the immediately following logic clock signal.

The present invention further comprises reading the output state generated by the logic circuit by generating a scan enable signal and a read signal, stopping the logic circuit's clock signal during the evaluate phase, providing the read signal to the scan circuits and the read/write drivers coupled to the scan circuits and to a scan register. Finally, the present invention includes forcing the output state of a scannable logic circuit that receives a first sequentially generated logic clock signal to a user-selected state, by loading the scan register with the user-selected output state, generating a scan enable signal and one or more write signals, stopping the sequentially generated logic clock signals when the first sequentially generated logic clock signal is in the evaluate phase, forcing all sequentially generated logic clock signals received by gates downstream of the scannable logic circuit to the precharge phase if they were in the evaluate phase when the clocks were stopped, providing the write signals to the scan circuits and to one or more of the read/write drivers, returning the sequentially generated logic clock signals to the evaluate phase if they were forced to the precharge phase, and restarting all clocks.

Other embodiments of the invention will be apparent to those skilled in the art after considering this specification or practicing the disclosed invention. The specification and examples above are exemplary only, with the true scope of the invention being indicated by the following claims.

We claim the following invention:

1. A scannable logic circuit, comprising:
   a clocked precharge logic circuit that includes a logic tree having one or more evaluate nodes, a precharge circuit, an evaluate circuit, and one or more output buffers, said logic circuit receives one or more input signals and a clock signal having an evaluate phase and a precharge phase, and produces one or more output signals;
   a scan control circuit that generates scan control signals, said scan control signals further comprise a scan enable signal;
   one or more scan registers;
   one or more read/write drivers coupled to said scan registers; and
   one or more scan circuits, each said scan circuit couples to one of said output buffers and to one of said scan registers through one of said read/write drivers, each said scan circuit receives said scan control signals from said scan control circuit, provides the state of said output signal to said scan register, and forces said output signal to a state specified by information in said scan register.

2. A scannable logic system, comprising:
   a clocked precharge logic circuit that includes a logic tree having one or more evaluate nodes, a precharge circuit, an evaluate circuit, and one or more output buffers, said logic circuit receives one or more input signals and a clock signal having an evaluate phase and a precharge phase, and produces one or more output signals;

a scan control circuit that generates scan control signals, said scan control signals further comprise a scan enable signal;

one or more scan registers;

one or more read/write drivers coupled to said scan registers; and one or more scan circuits, each said scan circuit couples to one of said output buffers and to one of said scan registers through one of said read/write drivers, each said scan circuit receives said scan control signals from said scan control circuit, provides the state of said output signal to said scan register, and forces said output signal to a state specified by information in said scan register.

3. A method that makes a scannable logic circuit, comprising:

providing a clocked precharge logic circuit that includes a logic tree having one or more evaluate nodes, a precharge circuit, an evaluate circuit, and one or more output buffers, said logic circuit receives one or more input signals and a clock signal having an evaluate phase and a precharge phase, and produces one or more output signals;

providing a scan control circuit that generates scan control signals, said scan control signals further comprise a scan enable signal;

providing one or more scan registers;

coupling one or more read/write drivers to said scan registers; and providing one or more scan circuits, each said scan circuit couples to one of said output buffers and to one of said scan registers through one of said read/write drivers, each said scan circuit receives said scan control signals from said scan control circuit, provides the state of said output signal to said scan register, and forces said output signal to a state specified by information in said scan register.

4. A method that reads the output state of a logic circuit, comprising:

generating one or more output signals from one or more input signals and a clock signal having an evaluate phase and a precharge phase provided to a clocked precharge logic circuit that includes a logic tree having one or more evaluate nodes, a precharge circuit, an evaluate circuit, and one or more output buffers;

generating scan control signals that further comprise a scan enable signal, a read signal, and one or more write signals;

stopping said clock signal during said evaluate phase;

providing said read signal to one or more scan circuits, wherein each said scan circuit is coupled to one of said output buffers; and providing said read signal to one or more read/write drivers, wherein each said read/write driver is coupled to one of said scan circuits and to a scan register.

5. A dependent claim according to claim 1, 2, 3, or 4 wherein said clocked precharge logic circuit comprises N-NARY logic.

6. A dependent claim according to claim 1, 2, 3, or 4 wherein said clock signal received by said logic circuit is one of at least 3 sequentially generated logic clock signals generated by a local clock generation circuit coupled to a clock spine, said logic clock signals have sequentially delayed phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signal.

7. A dependent claim according to claim 6, wherein said clock signal received by said logic circuit further comprises said one specific logic clock signal, said one or more input signals couple to a first sequentially clocked precharge logic gate that receives said immediately preceding logic clock signal, and said one or more output signals couple to a second sequentially clocked precharge logic gate that receives said immediately following logic clock signal.

8. A method that forces the output state of a logic circuit to a user-selected state, comprising:

loading a scan register with the user-selected output state of a scannable logic circuit that includes a logic tree having one or more evaluate nodes, a precharge circuit, an evaluate circuit, and one or more output buffers, said scannable logic circuit receives one or more input signals and a first clock signal having an evaluate phase and a precharge phase, said scannable logic circuit produces one or more output signals that couple to a clocked precharge logic circuit that receives a second clock signal having an evaluate phase and a precharge phase, wherein the evaluate phase of said first clock signal overlaps the evaluate phase of said second clock signal;

generating scan control signals, said scan control signals further comprise a read signal, one or more write signals, and a scan enable signal;

during the evaluate phase of said first clock signal, stopping said first clock signal and second clock signal;

forcing said second clock signal to the precharge phase if said second clock signal is stopped during the evaluate phase that overlaps the evaluate phase of said first clock signal, providing said one or more write signals to one or more scan circuits, wherein each said scan circuit is coupled to one of said output buffers; and providing said one or more write signals to one or more read/write drivers, wherein each said read/write driver is coupled to said scan register and to one of said scan circuits.

9. The method of claim 8 wherein said scannable logic circuit and said clocked precharge logic circuit comprise N-NARY logic.

10. The method of claim 8, wherein said first clock signal and said second clock signal are each one of at least 3 sequentially generated logic clock signals generated by a local clock generation circuit coupled to a clock spine, said sequentially generated logic clock signals have sequentially delayed phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signals, said method further comprises stopping all said sequentially generated logic clock signals.

11. The method of claim 10, further comprising forcing each said sequentially generated logic clock signal that is in the evaluate phase when all said sequentially generated logic clock signals are stopped to the precharge phase.

12. A scannable logic circuit, comprising:

a clocked precharge logic circuit that includes a logic tree having one or more evaluate nodes, a precharge circuit, an evaluate circuit, and one or more output buffers, said logic circuit produces one or more output signals and receives one or more input signals and a first clock signal that is one of at least 3 sequentially generated logic clock signals with an evaluate phase and a precharge phase generated by a clock generation circuit coupled to a clock spine, said sequentially generated logic clock signals have sequentially delayed phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signal;

wherein said one or more input signals received by said logic circuit couple to a first sequentially clocked precharge logic gate that receives a second clock signal that is the one of said at least 3 sequentially generated logic clock signals that immediately precedes said first clock signal, and said one or more output signals couple to a second sequentially clocked precharge logic gate that receives a third clock signal that is the one of said at least 3 sequentially generated logic clock signals that immediately follows said first clock signal;

a scan control circuit that generates scan control signals, said scan control signals further comprise a scan enable signal;

one or more scan registers;

one or more read/write drivers coupled to said scan registers; and one or more scan circuits, each said scan circuit couples to one of said output buffers and to one of said scan registers through one of said read/write drivers, each said scan circuit receives said scan control signals from said scan control circuit, provides the state of said output signal to said scan register, and forces said output signal to a state specified by information in said scan register.

13. A scannable logic system, comprising:

a clocked precharge logic circuit that includes a logic tree having one or more evaluate nodes, a precharge circuit, an evaluate circuit, and one or more output buffers, said logic circuit produces one or more output signals and receives one or more input signals and a first clock signal that is one of at least 3 sequentially generated logic clock signals with an evaluate phase and a precharge phase generated by a clock generation circuit coupled to a clock spine, said sequentially generated logic clock signals have sequentially delayed phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signal;

wherein said one or more input signals received by said logic circuit couple to a first sequentially clocked precharge logic gate that receives a second clock signal that is the one of said at least 3 sequentially generated logic clock signals that immediately precedes said first clock signal, and said one or more output signals couple to a second sequentially clocked precharge logic gate that receives a third clock signal that is the one of said at least 3 sequentially generated logic clock signals that immediately follows said first clock signal;

a scan control circuit that generates scan control signals, said scan control signals further comprise a scan enable signal;

one or more scan registers;

one or more read/write drivers coupled to said scan registers; and one or more scan circuits, each said scan circuit couples to one of said output buffers and to one of said scan registers through one of said read/write drivers, each said scan circuit receives said scan control signals from said scan control circuit, provides the state of said output signal to said scan register, and forces said output signal to a state specified by information in said scan register.

14. A method that makes a scannable logic circuit, comprising:

providing a clocked precharge logic circuit that includes a logic tree having one or more evaluate nodes, a precharge circuit, an evaluate circuit, and one or more output buffers, said logic circuit produces one or more output signals and receives one or more input signals and a first clock signal that is one of at least 3 sequentially generated logic clock signals with an evaluate phase and a precharge phase generated by a clock generation circuit coupled to a clock spine, said sequentially generated logic clock signals have sequentially delayed phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signal;

wherein said one or more input signals received by said logic circuit couple to a first sequentially clocked precharge logic gate that receives a second clock signal that is the one of said at least 3 sequentially generated logic clock signals that immediately precedes said first clock signal, and said one or more output signals couple to a second sequentially clocked precharge logic gate that receives a third clock signal that is the one of said at least 3 sequentially generated logic clock signals that immediately follows said first clock signal;

providing a scan control circuit that generates scan control signals, said scan control signals further comprise a scan enable signal;

providing one or more scan registers;

providing one or more read/write drivers coupled to said scan registers; and providing one or more scan circuits, each said scan circuit couples to one of said output buffers and to one of said scan registers through one of said read/write drivers, each said scan circuit receives said scan control signals from said scan control circuit, provides the state of said output signal to said scan register, and forces said output signal to a state specified by information in said scan register.

15. A scan method that reads the output state of a logic circuit, comprising:

generating one or more output signals from a clocked precharge logic circuit that includes a logic tree having one or more evaluate nodes, a precharge circuit, an evaluate circuit, and one or more output buffers, said logic circuit receives one or more input signals and first clock signal that is one of at least 3 sequentially generated logic clock signals with an evaluate phase and a precharge phase generated by a clock generation circuit coupled to a clock spine, said sequentially generated logic clock signals have sequentially delayed phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signal;

wherein said one or more input signals received by said logic circuit couple to a first sequentially clocked precharge logic gate that receives a second clock signal that is the one of said at least 3 sequentially generated logic clock signals that immediately precedes said first clock signal, and said one or more output signals couple to a second sequentially clocked precharge logic gate that receives a third clock signal that is the one of said at least 3 sequentially generated logic clock signals that immediately follows said first clock signal;

generating scan control signals that further comprise a scan enable signal, a read signal, and one or more write signals;

stopping said first clock signal during the evaluate phase;

providing said read signal to one or more scan circuits, wherein each said scan circuit is coupled to one of said output buffers; and providing said read signal to one or more read/write drivers, wherein each said read/write driver is coupled to one of said scan circuits and to a scan register.

16. A scan method that that forces the output state of a logic circuit to a user-selected state, comprising:

loading a scan register with the user-selected output state of a scannable logic circuit that includes a clocked precharge logic circuit that includes a logic tree having one or more evaluate nodes, a precharge circuit, an evaluate circuit, and one or more output buffers, said logic circuit produces one or more output signals and receives one or more input signals and a first clock signal that is one of at least 3 sequentially generated logic clock signals with an evaluate phase and a precharge phase generated by a clock generation circuit coupled to a clock spine, said sequentially generated logic clock signals have sequentially delayed evaluate phases and precharge phases, such that the evaluate phase of any one specific logic clock signal overlaps the evaluate phase of the immediately following logic clock signal by approximately the same amount of time that the evaluate phase of the immediately preceding logic clock signal overlaps the evaluate phase of said one specific logic clock signal;

wherein said one or more input signals received by said logic circuit couple to a first sequentially clocked precharge logic gate that receives a second clock signal that is the one of said at least 3 sequentially generated logic clock signals that immediately precedes said first clock signal, and said one or more output signals couple to a second sequentially clocked precharge logic gate that receives a third clock signal that is the one of said at least 3 sequentially generated logic clock signals that immediately follows said first clock signal;

generating scan control signals that further comprise a scan enable signal, a read signal, and one or more write signals;

stopping said first, second, and third logic clock signals during the evaluate phase of said first clock signal;

forcing said third clock signal to the precharge phase if said third clock signal received is stopped during the evaluate phase that overlaps the evaluate phase of said first clock signal;

providing said one or more write signals to one or more scan circuits, wherein each said scan circuit is coupled to one of said output buffers; and providing said one or more write signals to one or more read/write drivers, wherein each said read/write driver is coupled to said scan register and to one of said scan circuits.

* * * * *